United States Patent
Miura et al.

(10) Patent No.: US 10,102,314 B2
(45) Date of Patent: Oct. 16, 2018

(54) OPTIMAL OPERATION PATTERN SELECTION METHOD FOR MOTOR, OPTIMAL OPERATION PATTERN SELECTION PROGRAM FOR MOTOR, AND MOTOR SELECTION DEVICE

(71) Applicant: NSK LTD., Tokyo (JP)

(72) Inventors: Shota Miura, Kanagawa (JP); Masayuki Maruyama, Kanagawa (JP)

(73) Assignee: NSK LTD., Tokyo (JP)

( * ) Notice: Subject to any disclaimer, the term of this patent is extended or adjusted under 35 U.S.C. 154(b) by 357 days.

(21) Appl. No.: 14/896,834

(22) PCT Filed: Dec. 19, 2013

(86) PCT No.: PCT/JP2013/084167
§ 371 (c)(1),
(2) Date: Dec. 8, 2015

(87) PCT Pub. No.: WO2014/203430
PCT Pub. Date: Dec. 24, 2014

(65) Prior Publication Data
US 2016/0140264 A1 May 19, 2016

(30) Foreign Application Priority Data

Jun. 19, 2013 (JP) ................................ 2013-128948
Sep. 25, 2013 (JP) ................................ 2013-199002

(51) Int. Cl.
*G06F 17/50* (2006.01)
*G06F 17/10* (2006.01)
(Continued)

(52) U.S. Cl.
CPC ......... *G06F 17/5009* (2013.01); *G05B 19/19* (2013.01); *G06F 17/10* (2013.01); *H02P 23/0004* (2013.01); *H02P 29/00* (2013.01)

(58) Field of Classification Search
None
See application file for complete search history.

(56) References Cited

U.S. PATENT DOCUMENTS 4,609,855 A * 9/1986 Andrews ............ G05B 13/0245
318/561
7,911,162 B2 3/2011 Hanada
(Continued)

FOREIGN PATENT DOCUMENTS

CN 1610245 A 4/2005
CN 101438488 A 5/2009
(Continued)

OTHER PUBLICATIONS

Communication dated Sep. 21, 2016, from the European Patent Office in counterpart European Application No. 13887402.9.
(Continued)

*Primary Examiner* — Syed Roni
(74) *Attorney, Agent, or Firm* — Sughrue Mion, PLLC

(57) ABSTRACT

In an optimal operation pattern selection method, a plurality of selectable motors is selected and an optimal operation pattern from among the motor operation pattern defined by positioning time to rotate a motor output shaft of the motor to rotate a load by a positioning angle and stop time to stop the motor output shaft is suggested. The optimal operation pattern selection method includes a comprehensive determination step of calculating a comprehensive determination result according to an adaptable item, and storing the comprehensive determination result linked to each of the motors; and a list display step of displaying a list of the motors to enable to receive selection of one of the motors, together with the comprehensive determination result stored in the comprehensive determination step.

16 Claims, 18 Drawing Sheets

(51) Int. Cl.
   *G05B 19/19*   (2006.01)
   *H02P 23/00*   (2016.01)
   *H02P 29/00*   (2016.01)

(56) References Cited

U.S. PATENT DOCUMENTS

2010/0228697 A1   9/2010  Komiya et al.
2015/0084572 A1*  3/2015  Tanaka .................. G05B 11/42
                                                          318/568.1

FOREIGN PATENT DOCUMENTS

| CN | 101878589 A | 11/2010 |
| EP | 1524762 A2 | 4/2005 |
| EP | 2149982 A1 | 2/2010 |
| JP | 2001-229210 A | 8/2001 |
| JP | 2003-99479 A | 4/2003 |
| JP | 2006-042589 A | 2/2006 |
| JP | 2006-260350 A | 9/2006 |
| JP | 2011166953 A | 8/2011 |
| WO | 2008/139800 A1 | 11/2008 |
| WO | 2009/075152 A1 | 6/2009 |

OTHER PUBLICATIONS

Japanese Office Action of JP2013-199002 dated Mar. 25, 2014.
International Search Report of PCT/JP2013/084167 dated Mar. 25, 2014.
English language translation of a Commmunication dated Feb. 29, 2016, issued by the State Intellectual Property Office of the P.R.C. in corresponding Chinese Application No. 201380003682.5.

* cited by examiner

N: ROTATIONAL SPEED OF MOTOR [s⁻¹]
T: OUTPUT TORQUE [N·m] AT ROTATIONAL SPEED N
Tm: CONSTANT LOAD TORQUE [N·m]
Ti: DYNAMIC FRICTION TORQUE [N·m]
ta: ACCELERATION TIME [s]
tc: CONSTANT SPEED TIME [s]
td: DECELERATION TIME [s]
tb: STOP TIME [s]
tp: CYCLE PERIOD [s] (=ta+tc+td+tb)
te: POSITIONING TIME [s] (= ta+tc+td)

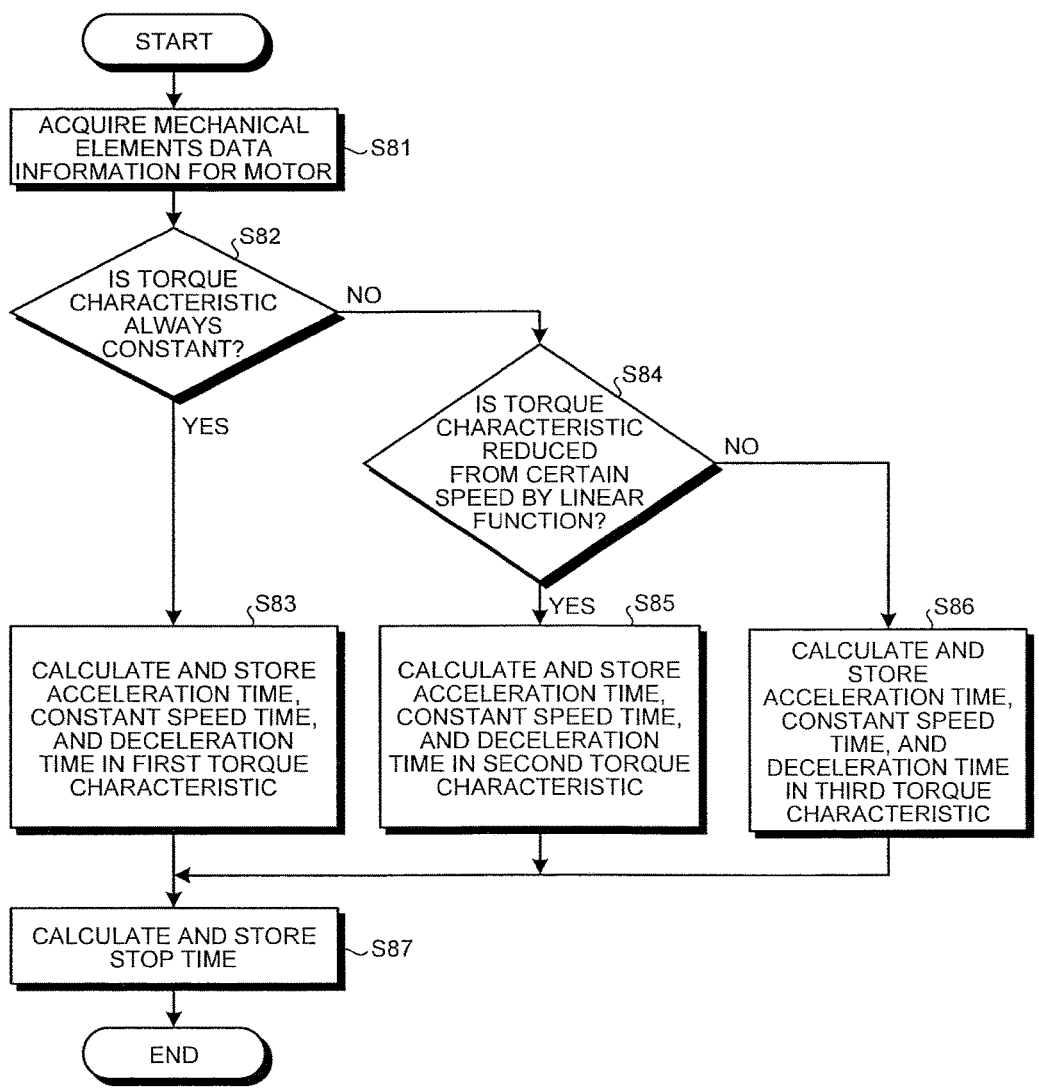

FIG.10

MECHANICAL ELEMENTS DATA (DB)

| BS SERIES NAME | BN CALL NUMBER | DNT N-T CHARA-CTERISTIC | Dbk BREAK POINT INFORMATION | DNTK TORQUE CHARACTERISTIC INFORMATION COEFFICIENT a | DNTK COEFFICIENT b | DRT RATED TORQUE | DJI ROTOR INERTIA MOMENT | DMT MAXIMUM OUTPUT TORQUE | DST SEAL FRICTION TORQUE | DNmax MAXIMUM ROTATIONAL SPEED | |
|---|---|---|---|---|---|---|---|---|---|---|---|
| PS SERIES | M-PS1xxx | NTps1 | bpk1 | aps1 | bps1 | rt1 | Jir1 | mt1 | st1 | nm1 | ... |
| | M-PS2xxx | NTps2 | bpk2 | aps2 | bps2 | rt2 | Jir2 | mt2 | st2 | nm2 | ... |
| | M-PS3xxx | NTps3 | bpk3 | aps3 | bps3 | rt3 | Jir3 | mt3 | st3 | nm3 | ... |
| | M-PS4xxx | NTps4 | bpk4 | aps4 | bps4 | rt4 | Jir4 | mt4 | st4 | nm4 | ... |
| | M-PS5xxx | NTps5 | bpk5 | aps5 | bps5 | rt5 | Jir5 | mt5 | st5 | nm5 | ... |
| | M-PS6xxx | NTps6 | bpk6 | aps6 | bps6 | rt6 | Jir6 | mt6 | st6 | nm6 | ... |
| | M-PS7xxx | NTps7 | bpk7 | aps7 | bps7 | rt7 | Jir7 | mt7 | st7 | nm7 | ... |
| PN SERIES | M-PN1xxx | NTpn1 | bpk8 | apn1 | bpn1 | rt8 | Jir8 | mt8 | st8 | nm8 | ... |
| | M-PN2xxx | NTpn2 | bpk9 | apn2 | bpn2 | rt9 | Jir9 | mt9 | st9 | nm9 | ... |
| | M-PN3xxx | NTpn3 | bpk10 | apn3 | bpn3 | rt10 | Jir10 | mt10 | st10 | nm10 | ... |
| | M-PN4xxx | NTpn4 | bpk11 | apn4 | bpn4 | rt11 | Jir11 | mt11 | st11 | nm11 | ... |
| | M-PN5xxx | NTpn5 | bpk12 | apn5 | bpn5 | rt12 | Jir12 | mt12 | st12 | nm12 | ... |
| | M-PN6xxx | NTpn6 | bpk13 | apn6 | bpn6 | rt13 | Jir13 | mt13 | st13 | nm13 | ... |
| Z SERIES | M-PZ1xxx | NTpz1 | bpk14 | apz1 | bpz1 | rt14 | Jir14 | mt14 | st14 | nm14 | ... |
| | M-PZ2xxx | NTpz2 | bpk15 | apz2 | bpz2 | rt15 | Jir15 | mt15 | st15 | nm15 | ... |
| | M-PZ3xxx | NTpz3 | bpk16 | apz3 | bpz3 | rt16 | Jir16 | mt16 | st16 | nm16 | ... |

| REPEATED POSITIONING ACCURACY | SETTLING TIME | SELECT | |
|---|---|---|---|
| FROM ±100 SECONDS | 0.001 s | ● | R1 |
| ±10 TO 100 SECONDS | 0.04 s | ○ | R2 |
| ±2 TO 10 SECONDS | 0.1 s | ○ | R3 |

| ITEM | RESULT | THRE-SHOLD | DETERMI-NATION | COMMENTS |
|---|---|---|---|---|
| DETAILS OF SIMULATION | | | | |
| INERTIA MOMENT OF LOAD [kgm$^2$] | 0.064 | 0.015-0.24 | OK | |
| LOAD TORQUE (CONSTANT) [Nm] | 0 | <1.5 | OK | |
| POSITIONING TIME | 0.059 | <0.3 | OK | |
| CYCLE PERIOD | 0.429 | ≤0.3 | NG | RATED TORQUE IS NOT SUFFICIENT. POSITIONING TIME IS ELONGATED BY LIMITING TORQUE OR BY LIMITING MAXIMUM SPEED, BUT STOP TIME IS SHORTENED AND REQUIRED CYCLE PERIOD MAY BE SATISFIED. REQUIRED CYCLE PERIOD= REQUIRED POSITIONING TIME+REQUIRED STOP TIME |

FIG.21

| SIMULATION RESULT LIST | | | | |
|---|---|---|---|---|
| SERIES NAME | CALL NUMBER | COMPREHENSIVE DETERMINATION RESULT | COMMENTS | SELECT |
| PS SERIES | M-PS1xxx | △ | CYCLE PERIOD OF SHORTEST-TIME POSITIONING EXCEEDS REQUIRED CYCLE PERIOD. REQUIREMENTS MAY BE SATISFIED BY ADJUSTING OUTPUT TORQUE AND MAXIMUM ROTATIONAL SPEED. | ○ |
| | M-PS2xxx | △ | CYCLE PERIOD OF SHORTEST-TIME POSITIONING EXCEEDS REQUIRED CYCLE PERIOD. REQUIREMENTS MAY BE SATISFIED BY ADJUSTING OUTPUT TORQUE AND MAXIMUM ROTATIONAL SPEED. | ○ |
| | M-PS3xxx | ○ | USABLE | ○ |
| | M-PS4xxx | △ | CYCLE PERIOD OF SHORTEST-TIME POSITIONING EXCEEDS REQUIRED CYCLE PERIOD. REQUIREMENTS MAY BE SATISFIED BY ADJUSTING OUTPUT TORQUE AND MAXIMUM ROTATIONAL SPEED. | ○ |
| | M-PS5xxx | ○ | USABLE | ○ |
| | M-PS6xxx | × | INERTIA MOMENT OF LOAD IS OUT OF RECOMMENDED RANGE. | ○ |
| | M-PS7xxx | × | INERTIA MOMENT OF LOAD IS OUT OF RECOMMENDED RANGE. | ○ |
| PN SERIES | M-PN1xxx | △ | CYCLE PERIOD OF SHORTEST-TIME POSITIONING EXCEEDS REQUIRED CYCLE PERIOD. REQUIREMENTS MAY BE SATISFIED BY ADJUSTING OUTPUT TORQUE AND MAXIMUM ROTATIONAL SPEED. | ○ |
| | M-PN2xxx | × | INERTIA MOMENT OF LOAD IS OUT OF RECOMMENDED RANGE. | ○ |
| | M-PN3xxx | × | INERTIA MOMENT OF LOAD IS OUT OF RECOMMENDED RANGE. | ○ |
| | M-PN4xxx | × | INERTIA MOMENT OF LOAD IS OUT OF RECOMMENDED RANGE. | ○ |
| | M-PN5xxx | × | INERTIA MOMENT OF LOAD IS OUT OF RECOMMENDED RANGE. | ○ |
| | M-PN6xxx | × | INERTIA MOMENT OF LOAD IS OUT OF RECOMMENDED RANGE. | ○ |
| Z SERIES | M-PZ1xxx | × | INERTIA MOMENT OF LOAD IS OUT OF RECOMMENDED RANGE. | ○ |
| | M-PZ2xxx | × | INERTIA MOMENT OF LOAD IS OUT OF RECOMMENDED RANGE. | ○ |
| | M-PZ3xxx | × | INERTIA MOMENT OF LOAD IS OUT OF RECOMMENDED RANGE. | ○ |

INPUT SCREEN     SELECT

OPTIMAL OPERATION PATTERN SELECTION METHOD FOR MOTOR, OPTIMAL OPERATION PATTERN SELECTION PROGRAM FOR MOTOR, AND MOTOR SELECTION DEVICE

CROSS REFERENCE TO RELATED APPLICATIONS

This is a National Stage of International Application No. PCT/JP2013/084167 filed Dec. 19, 2013, claiming priority based on Japanese Patent Application No. 2013-128948 filed Jun. 19, 2013 and No. 2013-199002 filed Sep. 25, 2013, the contents of all of which are incorporated herein by reference in their entirety.

BACKGROUND OF THE INVENTION

1. Field of the Invention

The present invention relates to an optimal operation pattern selection method for a motor, an optimal operation pattern selection program for a motor, and a motor selection device.

2. Description of the Related Art

Prior Art 1 discloses a servomotor selection device including: a selection unit for a servo system driven by a servomotor; an input unit for mechanical elements of a servo system; an input unit for a movement pattern of a load of a servo system; a calculation unit to acquire required specifications for a servomotor based on output results of the selection unit for a servo system, the input unit for mechanical elements of a servo system, and the input unit for a load movement pattern; and a search unit for a servomotor adaptive to the servo system based on the required specifications acquired in the calculation unit.

Prior Art 2 discloses a selection system for a drive motor and a reducer in an actuator, in which a minimum reducer capable of driving a load mechanism is temporarily selected first by a computer, subsequently a minimum drive motor capable of driving the reducer temporarily selected as a load mechanism is temporarily selected, next verification is made on whether combination of the load mechanism with the temporarily selected reducer and the temporarily selected drive motor satisfies specifications of the temporarily selected reducer. In the case of not satisfying the specifications, temporary selection of the drive motor and the verification are repeated by increasing the size of the reducer until all of the specifications are satisfied, and an optimal drive motor and an optimal reducer are finally selected at the same time.

PRIOR ART

Prior Art 1: Japanese Patent Application Laid-open No. 2006-42589

Prior Art 2: Japanese Patent Application Laid-open No. 2003-99479

According to the technologies of Prior Arts 1 and 2, an operation pattern is varied by a purpose of use of a motor, and therefore, a user needs to preliminarily determine and input the operation pattern in accordance with the purpose of use of the motor. In the case of selecting a motor adaptive to the operation pattern upon determining the operation pattern, the motor is selected based on a determination standard whether the selected motor can be used with the operation pattern. However, complex calculation is needed to obtain an optimal operation pattern for each motor, and the motor is selected based on the operation pattern temporarily determined in the technologies of Prior Arts 1 and 2. Therefore, the temporarily determined operation pattern is not constantly the optimal operation pattern which satisfies intention of a user. Further, since the motor is selected based on the temporarily determined operation pattern, the selected motor tends to have excessive performance.

The present invention is made in view of the above circumstances, and is directed to providing an optimal operation pattern selection method for a motor, an optimal operation pattern selection program for a motor, and a motor selection device, in which manpower to determine an operation pattern for a motor is reduced and selectable motor information is provided.

SUMMARY OF THE INVENTION

It is an object of the present invention to at least partially solve the problems in the conventional technology. According to an aspect of the invention, in an optimal operation pattern selection method for a motor, a plurality of selectable motors is selected and an optimal operation pattern is suggested from among motor operation patterns defined by positioning time to rotate a motor output shaft of the motor to rotate a load by a positioning angle and stop time to stop the motor output shaft. The optimal operation pattern selection method includes a comprehensive determination step of calculating a comprehensive determination result according to an adaptable item, and storing the comprehensive determination result linked to each of the motors; and a list display step of displaying, together with the comprehensive determination result stored in the comprehensive determination step, a list of the motors to enable to receive selection of one of the motors.

According to the method, it is possible to estimate, from among the plurality of selectable motors, the motor for which the optimal operation pattern can be selected based on the comprehensive determination result even when the operation pattern for the motor is not determined. Therefore, the operation pattern can be studied upon narrowing down a target of the motor. As a result, possibility that the selected motor has excessive performance can be reduced.

As a preferable aspect of the present invention, the optimal operation pattern selection method for a motor is, from among motor operation patterns defined by positioning time to rotate a motor output shaft of the motor to rotate a load by a positioning angle and stop time to stop the motor output shaft, a method of selecting a plurality of selectable motors and suggesting an optimal operation pattern. The method preferably includes: a simulation conditions input step of acquiring information of simulation conditions including an input value of the positioning angle and an input value of inertia moment of the load as operating conditions, and at least one of an input value of required positioning time and an input value of required stop time as required conditions; a simulation step of simulating, an operation pattern under the simulation conditions for each of the stored motors based on mechanical elements data information for each of the selectable motors; a comparison step of comparing, with the operating conditions and the required conditions, each operation pattern for each of the motors obtained in the simulation step, comparing each item with a predetermined threshold, and storing an adaptability determination result; a comprehensive determination step of calculating a comprehensive determination result according to an adaptable item obtained in the comparison step, and storing the comprehensive determination result linked to each of the motors; and a list display step of displaying a list of the motors together with the comprehensive determination result stored in the comprehensive determination step.

According to the method, even when a user does not preliminarily determine an operation pattern in accordance with a purpose of use, it is possible to estimate the motor for which the optimal operation pattern can be selected from among the plurality of selectable motors only based on predetermined input information. Therefore, the operation pattern can be studied upon narrowing down the target of the motor. As a result, possibility that the selected motor has excessive performance can be reduced.

As a desirable aspect of the invention, in the case where an item of the operating conditions is adaptable and an item of the required conditions is not adaptable, a determination result indicating partially adaptable is provided as the comprehensive determination result in the comprehensive determination step.

According to the method, the user can leave, as a choice, even a motor not satisfying the conditions. Since the motor having a non-adaptable item in the operating conditions is excluded, the motor having no possibility of use is excluded from the choice, and the target of the motor can be narrowed down. Therefore, the user can study the operation pattern for the motor by reconsidering the operation pattern. As a result, possibility that the selected motor has excessive performance can be reduced.

As a desirable aspect of the invention, the determination result indicating partially adaptable is displayed on the list of the motors in the list display step.

According to the method, an operator can grasp a choice of the adaptable motor at a glance.

As a desirable aspect of the invention, the simulation step is executed under the condition that the input value of the positioning angle, the input value of the inertia moment of the load, the input value of the required positioning time or the input value of the required stop time are input in the simulation conditions input step.

According to the method, since the motor is selected based on the simulated operation pattern, a burden of calculation on the operator can be reduced.

As a desirable aspect of the invention, the simulation step includes: calculating a total value of inertia moment by adding rotor inertia moment of the mechanical elements data information with the input value of the inertia moment of the load; and acquiring shortest positioning time to rotate the load by the input value of the positioning angle based on the total value of the inertia moment and torque characteristic information according to a rotational angular speed or a rotational speed included in the mechanical elements data information, and simulating an operation pattern having the shortest positioning time for each of the motors. According to the method, the operation pattern that can shorten cycle time by minimizing time to complete positioning can be simulated.

As a desirable aspect of the invention, in the case where the torque characteristic information according to a rotational angular speed or a rotational speed of a stored motor has constant output torque when rotation of the output shaft is varied from zero to a maximum rotational angular speed or a maximum rotational speed, an operation pattern is simulated such that rotation by the positioning angle is performed by rotation of the output shaft during acceleration time in which rotation of the motor output shaft is accelerated and during deceleration time in which rotation of the motor output shaft is decelerated. According to the method, the operation pattern that can shorten cycle time by minimizing time to complete positioning can be simulated.

As a desirable aspect of the invention, in the case where the torque characteristic information according to a rotational angular speed or a rotational speed of a stored motor has a break point which is a change point where output torque is reduced while rotation of the output shaft changes from zero to a maximum rotational angular speed or while rotation of the output shaft changes from zero to a maximum rotational speed, an operation pattern is simulated in a first area where a rotational angular speed or a rotational speed changes to the break point such that rotation by the positioning angle is performed by rotation of the output shaft during the acceleration time in which rotation of the motor output shaft is accelerated and deceleration time in which rotation of the motor output shaft is decelerated. According to the method, the operation pattern that can shorten cycle time by minimizing time to complete positioning can be simulated.

As a desirable aspect of the invention, in the case where the torque characteristic information according to a rotational angular speed or a rotational speed of a stored motor has a break point which is a change point where output torque is reduced while rotation of the output shaft changes from zero to a maximum rotational angular speed or while rotation of the output shaft changes from zero to a maximum rotational speed, an operation pattern is simulated in a first area where a rotational angular speed or a rotational speed changes to the break point such that rotation by the positioning angle is performed by rotation of the output shaft during the acceleration time in which rotation of the motor output shaft is accelerated and deceleration time in which rotation of the motor output shaft is decelerated. According to the method, the operation pattern that minimizes the time to complete positioning can be simulated with high accuracy even when there is a torque characteristic in which the more increased the rotational angular speed or the rotational speed of the motor is, the more phenomenon the torque is.

As a desirable aspect of the invention, positioning time to rotate the motor output shaft in the second area is shortest positioning time among positioning time calculated for each of sections obtained by dividing the second area into a plurality of the sections. According to the method, the operation pattern that minimizes the time to complete positioning can be simulated with high accuracy even when there is a torque characteristic in which the more increased the rotational angular speed or the rotational speed of the motor is, the more phenomenon the torque is.

As a desirable aspect of the invention, the input value of the required positioning time is input in the simulation conditions input step, and the input value of the required positioning time is input as the threshold, the shortest positioning time is compared with the threshold, and the adaptability determination result is stored in the comparison step. According to the method, the optimal operation pattern for the motor, which can minimize the time to complete positioning, can be studied. As a result, possibility that the selected motor has excessive performance can be reduced.

As a desirable aspect of the invention, an optimal operation pattern selection program for a motor in the optimal operation pattern selection method for a motor causes a computer to execute processing including the comprehensive determination step and the list display step.

According to the program, it is possible to estimate the motor for which the optimal operation pattern can be selected from among the plurality of selectable motors based on the comprehensive determination result even when the operation pattern for the motor is not determined. Therefore, the operation pattern can be studied upon narrowing down a target of the motor. As a result, possibility that the selected motor has excessive performance can be reduced.

As a desirable aspect of the invention, a motor selection device is configured to select a plurality of selectable motors and suggest an optimal operation pattern from among motor operation patterns defined by positioning time to rotate a motor output shaft of the motor to rotate a load by a positioning angle and stop time to stop the motor output shaft. The motor selection device includes a calculation unit configured to compare each item with a predetermined threshold, and calculate a comprehensive determination result according to the item obtained as adaptable; and an information output unit configured to output, by linking the comprehensive determination result to each of the motors, information of a list of the motors to enable to receive selection of one of the motors from an input access unit.

According to the configuration, it is possible to estimate the motor for which the optimal operation pattern can be selected from among the plurality of selectable motors based on the comprehensive determination result even when the operation pattern for the motor is not determined. Therefore, the operation pattern can be studied upon narrowing down a target of the motor. As a result, possibility that the selected motor has excessive performance can be reduced.

As a preferable aspect of the present invention, a motor selection device is configured to select a plurality of selectable motors and suggest an optimal operation pattern from among motor operation patterns defined by positioning time to rotate a motor output shaft of the motor to rotate a load by a positioning angle and stop time to stop the motor output shaft. The motor selection device preferably includes: an input access unit to perform input receiving processing for information of simulation conditions including at least one of an input value of the positioning angle and an input value of inertia moment of the load as operating conditions, and an input value of required positioning time and an input value of required stop time as required conditions; a storage unit to store mechanical elements data information for each of the selectable motors; a calculation unit to simulate, for each of the stored motors, an operation pattern under the simulation conditions, compare the obtained operation pattern for each of the motors with the operating conditions and the required conditions, compare each item with a predetermined threshold, and calculate a comprehensive determination result according to the item obtained as adaptable; and an information output unit to output information of a list of the motors by linking the comprehensive determination result to each of the motors.

According to the configuration, even when the user does not preliminarily determine the operation pattern in accordance with the purpose of use, it is possible to estimate the motor for which the optimal operation pattern can be selected from among the plurality of selectable motors only based on predetermined input information. Therefore, the operation pattern can be studied upon narrowing down a target of the motor. As a result, possibility that the selected motor has excessive performance can be reduced.

As a desirable aspect of the invention, in the case where an item of the operation conditions is adaptable and an item of the required conditions is not adaptable, the calculation unit provides a determination result indicating partially adaptable as the comprehensive determination result.

According to the method, the user can leave, as a choice, even a motor not satisfying the conditions. Since the motor having a non-adaptable item in the operating conditions is excluded, the motor having no possibility of use is excluded from the choice, and the target of the motor can be narrowed down. Therefore, the user can study the operation pattern for the motor by reconsidering the operation pattern. As a result, possibility that the selected motor has excessive performance can be reduced.

As a desirable aspect of the invention, the information output unit outputs information including the determination result indicating partially adaptable in the list of the motors.

According to the aspect, assistance can be provided such that the operator can grasp the choices of the adaptable motor at a glance.

As a desirable aspect of the invention, the calculation unit performs calculation processing to simulate the operation pattern under the condition that the input value of the positioning angle, the input value of the inertia moment of the load, the input value of the required positioning time, or the input value of the required stop time are input.

According to the aspect, assistance to reduce a burden of calculation on the operator can be provided because the motor is selected based on the simulated operation pattern.

As a desirable aspect of the invention, the calculation unit calculates a total value of inertia moment by adding rotor inertia moment of the mechanical elements data information with the input value of the inertia moment of the load, acquires shortest positioning time to rotate the load by the input value of the positioning angle based on the total value of the inertia moment and torque characteristic information according to a rotational angular speed or a rotational speed included in the mechanical elements data information, and simulates an operation pattern having the shortest positioning time for each of the motors. According to the aspect, the operation pattern that can shorten the cycle time by minimizing the time to complete positioning can be simulated.

According to the present invention, it is possible to provide an optimal operation pattern selection method for a motor, a non-transitory computer-readable storage medium that stores therein an optimal operation pattern selection program to select optimum operation pattern of a motor for a motor selection device, and a motor selection device, in which manpower to determine an operation pattern for a motor is reduced and selectable motor information is provided.

BRIEF DESCRIPTION OF THE DRAWINGS

FIG. 9 is an explanatory diagram illustrating an exemplary flowchart to calculate an operation pattern for a motor according to the present embodiment.

FIG. 10 is an explanatory diagram illustrating an exemplary motor database storing mechanical elements data information for each of selectable motors according to the present embodiment.

FIG. 20 is an explanatory diagram illustrating an output display screen to display exemplary items compared in the comparison step using the operating conditions and the required conditions, and exemplary determination results.

FIG. 21 is an explanatory diagram illustrating an output display screen to display an exemplary comprehensive determination result.

DETAILED DESCRIPTION OF THE PREFERRED EMBODIMENT

Modes to implement the present invention (embodiments) will be described in detail with reference to the drawings. Note that the present invention is not limited by the content recited in the following embodiments. Further, components recited in the following may include those readily conceivable by men skilled in the art and those substantially equivalent. Further, the components recited in the following can be suitably combined. Additionally, a device, a system, a method, and a modified example recited in the embodiments can be optionally combined within a range obvious to the men skilled in the art.

Figure 1:
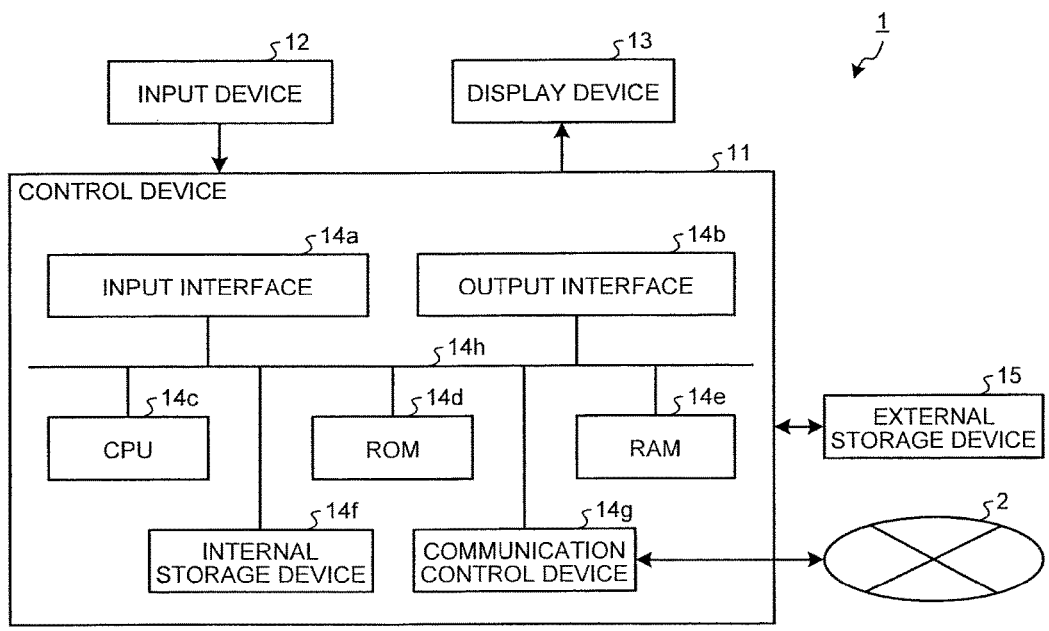
FIG. 1 is a diagram illustrating a configuration of a motor selection device according to the present embodiment.

FIG. 1 is a diagram illustrating a configuration of a motor selection device according to the present embodiment. As illustrated in FIG. 1, a motor selection device 1 includes a control device 11, an input device 12, a display device 13, and an external storage device 15. In the motor selection device 1, the control device 11 has a communication control device 14g which is connectable to a network 2.

The input device 12 is an input access unit such as a mouse and a keyboard, and receives input operation and select operation by a designer who is an operator (user), and outputs an input signal to the control device 11. The display device 13 is a device to display an image, such as a cathode ray tube (CRT) and a liquid crystal display, and also is an information output unit.

The control device 11 is a computer such as a personal computer (PC) and a server system, and includes an input interface 14a, an output interface 14b, a central processing unit (CPU) 14c, a read only memory (ROM) 14d, a random access memory (RAM) 14e, an internal storage device 14f, the communication control device 14g, and an internal bus 14h. The input interface 14a, output interface 14b, CPU 14c, ROM 14d, RAM 14e, internal storage device 14f, and communication control device 14g are connected via the internal bus 14h.

The input interface 14a receives an input signal from the input device 12, and outputs the input signal to the CPU 14c. The output interface 14b receives an image signal from the CPU 14c, and outputs the image signal to the display device 13.

The ROM 14d stores a program such as a basic input output system (BIOS). The internal storage device 14f is, for example, a hard disk drive (HDD), a flash memory, or the like, and stores an operating system program, an application program, and an optimal operation pattern selection program for a motor according to the present embodiment. The CPU 14c is a calculation unit, and implements various kinds of functions by executing programs stored in the ROM 14d and internal storage device 14f while using the RAM 14e as a work area.

The external storage device 15 is an HDD, a server, or the like. The internal storage device 14f or the external storage device 15 stores motor database storing mechanical elements data information for each of selectable motors. The mechanical elements data information includes, for each of the selectable motors, information containing a rotor inertia moment, a rotational speed-torque characteristic (N-T characteristic), rated torque, seal friction torque, a maximum rotational speed (maximum rotational angular speed), a break point speed, and maximum output torque, which are linked one another. Thus, the internal storage device 14f or the external storage device 15 functions as a storage unit. Meanwhile, the rotational speed-torque characteristic (N-T characteristic) may be stored in the internal storage device 14f or the external storage device 15 as rotational angular speed-torque characteristic data.

Figure 2:
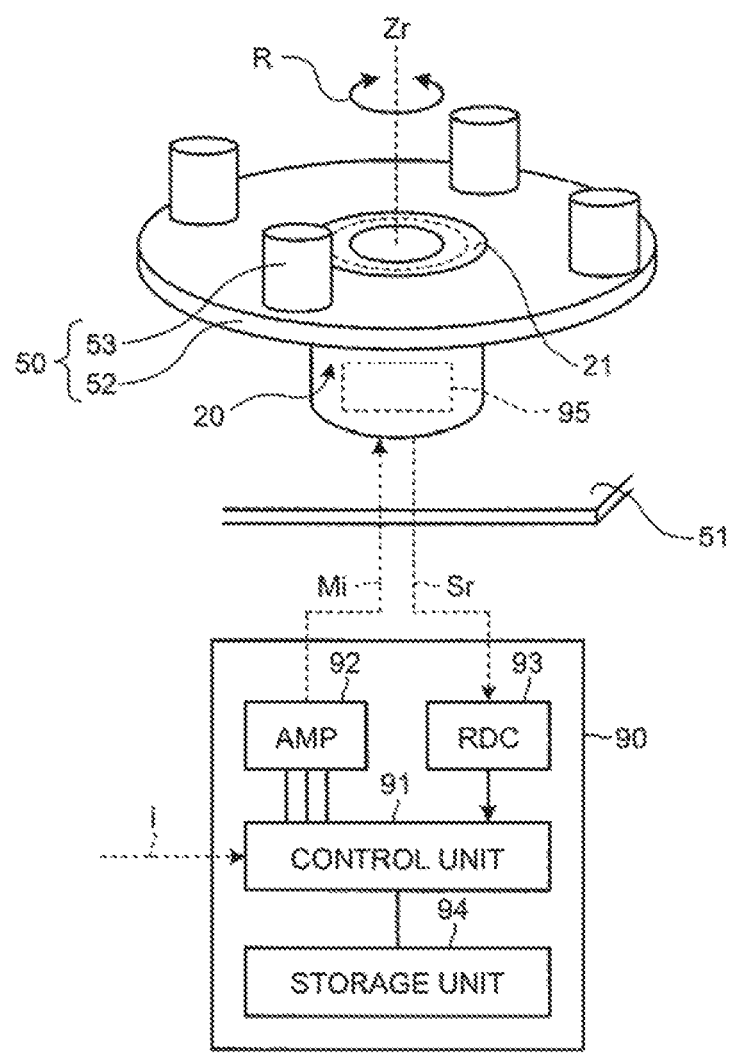
FIG. 2 is an explanatory diagram illustrating a use state of a motor according to the present embodiment.

FIG. 2 is an explanatory diagram illustrating a use state of a motor according to the present embodiment. As illustrated in FIG. 2, a motor 20 is fixed to a support member 51, and used as a load body 50 mounted with a conveying plate 52 that moves a conveyed object 53 in a manner rotatable around a rotary axis Zr in an R direction of either normal rotation or reverse rotation, for example. The conveyed object 53 is, for example, a component such as a light emitting diode, a ceramic capacitor, a chip resistor, and an on-vehicle integrated circuit.

The motor 20 determines a position of the conveyed object 53 conveyed by the conveying plate 52 in accordance with a position of a motor output shaft 21. Thus, the motor 20 can directly transmit rotational force to the conveyed object 53 and the conveying plate 52, namely, the load body 50 without interposing a transmission mechanism such as a gear, a belt, or a roller, and can rotate the conveyed object 53. The motor 20 is a so-called direct drive motor in which a motor rotary shaft and the load body 50 are directly connected. With this configuration, the motor 20 can determine the position of conveyed object 53 with high accuracy.

As illustrated in FIG. 2, when a motor rotation command i is received from an external computer, a motor control circuit 90 outputs a drive signal from a control unit (central processing unit (CPU)) 91 to a three-phase amplifier (amplifier (AMP)) 92 in accordance with an operation pattern stored in a storage unit 94. The motor control circuit 90 supplies the motor 20 with drive current Mi from the AMP 92 via a wire. The motor 20 rotates the conveying plate 52 by the drive current Mi so as to move the conveyed object 53. When the conveying plate 52 is rotated, a rotation angle detector such as a resolver 95 detects a rotation angle and outputs a detection signal (resolver signal) Sr. The motor control circuit 90 receives the detection signal Sr and digitally converts the received detection signal Sr by a resolver-5 to-digital converter (RDC) 93. The CPU 91 determines whether the conveyed object 53 has reached a commanded position based on digital information of the detection signal Sr from the RDC 93. In the case that the conveyed object 53 has reached the commanded position, the drive signal to the AMP 92 is stopped.

Figure 3:
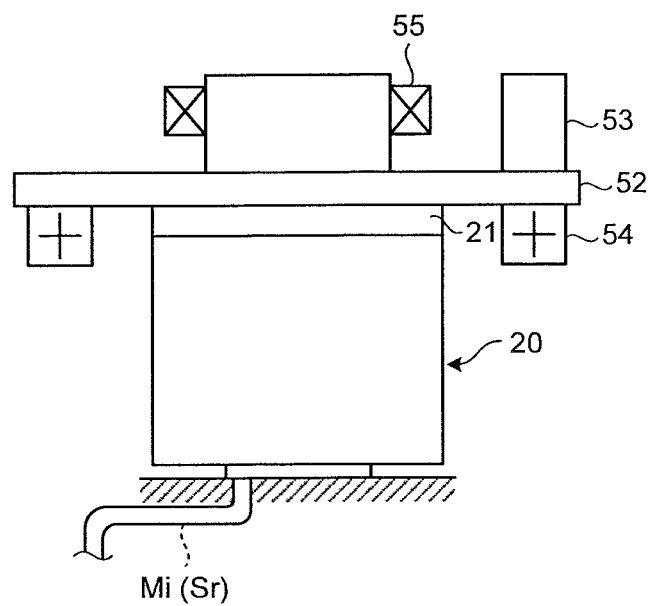
FIG. 3 is an explanatory diagram illustrating components to be mounted on the motor according to the present embodiment.

As illustrated in FIG. 2, inertia moment of the load body 50 is added to the motor output shaft 21 of the motor 20 in accordance with number, a shape, mass, and a size of the conveyed object 53 and a shape, mass, and a size of the conveying plate 52. The inertia moment of a load by the load body 50 is a sum of the inertia moment of the load mounted on the motor 20, and magnitude of the inertia moment of the load influences acceleration/deceleration characteristics. Therefore, in the case of selecting an operation pattern for a motor and the motor, it is necessary to consider the inertia moment of the load by the load body 50. Further, FIG. 3 is an explanatory diagram illustrating components to be mounted on the motor according to the present embodiment. As illustrated in FIG. 3, there may be a case where a bearing 54 to support the conveying plate 52 and an oil seal 55 are mounted on the motor 20 besides the conveying plate 52 and the conveyed object 53, and dynamic friction torque may be caused at the motor output shaft 21 of the motor 20.

Generally, an operation pattern is varied by a purpose of use of the motor. For example, the operation pattern is required to satisfy one of following conditions: a period during which the motor is rotated is shortest; a period during which the motor is needed to be stopped is shortest; effective torque of the motor is minimized; an acceleration/deceleration speed is maximized; and rotational speed (rotational angular speed) is a constant speed or less.

A user of a motor may not be always familiar with a motor to be selected, and a large burden may be imposed on the user to verify whether a result of a calculated operation pattern is an optimal operation pattern for the selected motor although the operation pattern is calculated by the user himself or herself. Further, a large burden may be imposed on the user of the motor to make adjustment such that the result of the calculated operation pattern becomes the optimal operation pattern for the selected motor. Therefore, when the user of the motor reduces such burdens by selecting a motor having excessive performance, cost for the motor may be increased.

Figure 4:
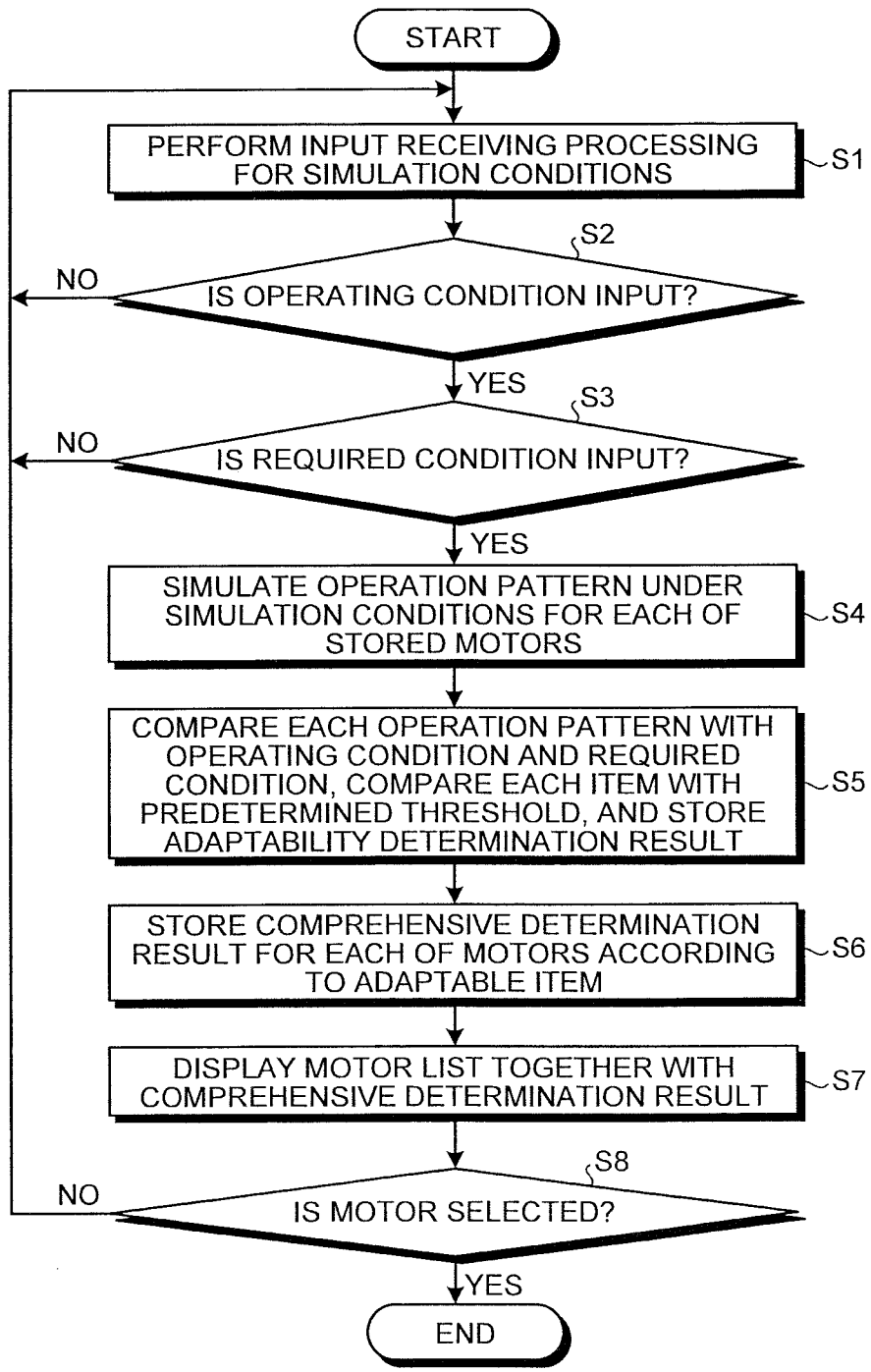
FIG. 4 is a flowchart illustrating an exemplary operating procedure of an optimal operation pattern selection method for a motor executed by the motor selection device according to the present embodiment.

To avoid such situations, a motor selection device according to the present embodiment executes an optimal operation pattern selection program for a motor illustrated in FIG. 4, and performs an optimal operation pattern selection method. FIG. 4 is a flowchart illustrating an exemplary operating procedure of the optimal operation pattern selection method for a motor executed by the motor selection device according to the present embodiment.

Figure 5:
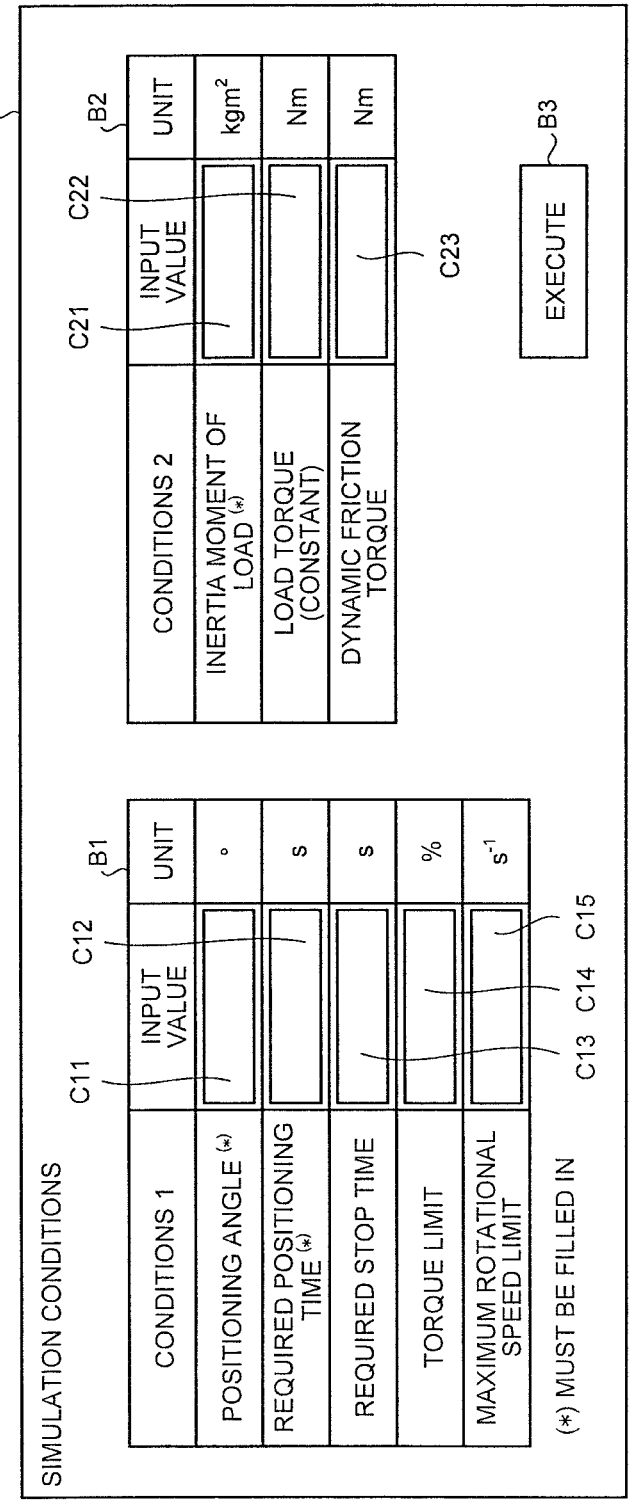
FIG. 5 is an explanatory diagram illustrating an exemplary input screen of the motor selection device according to the present embodiment.

First, the control device 11 of the motor selection device 1 performs input receiving processing for simulation conditions, and executes an input step of the simulation conditions to acquire information of the simulation conditions (Step S1). FIG. 5 is an explanatory diagram illustrating an exemplary input screen of the motor selection device according to the present embodiment. As illustrated in FIG. 5, the display device 13 displays an input screen G1 to the user. The CPU 14c of the control device 11 receives respective input values in a box B1 at conditions 1 among the simulation conditions input from the input device 12. For example, the CPU 14c can receive an input value C11 of a positioning angle, an input value C12 of required positioning time, an input value C13 of required stop time, an input value C14 of a torque limit, and an input value C15 of a maximum rotational speed limit, which are input from the input device 12, and then stores the input values in the external storage device 15 or the internal storage device 14f as the information of the simulation conditions.

In the same manner, the CPU 14c of the control device 11 receives respective input values in a box B2 of conditions 2 illustrated in FIG. 5 among the simulation conditions input from the input device 12. For example, the CPU 14c receives one or more of an input value C21 of the inertia moment of the load, an input value C22 of load torque (constant), and an input value C23 of dynamic friction torque, which are input from the input device 12, and then the CPU 14c stores the input values in the external storage device 15 or the internal storage device 14f as the information of the simulation conditions.

Figure 6:
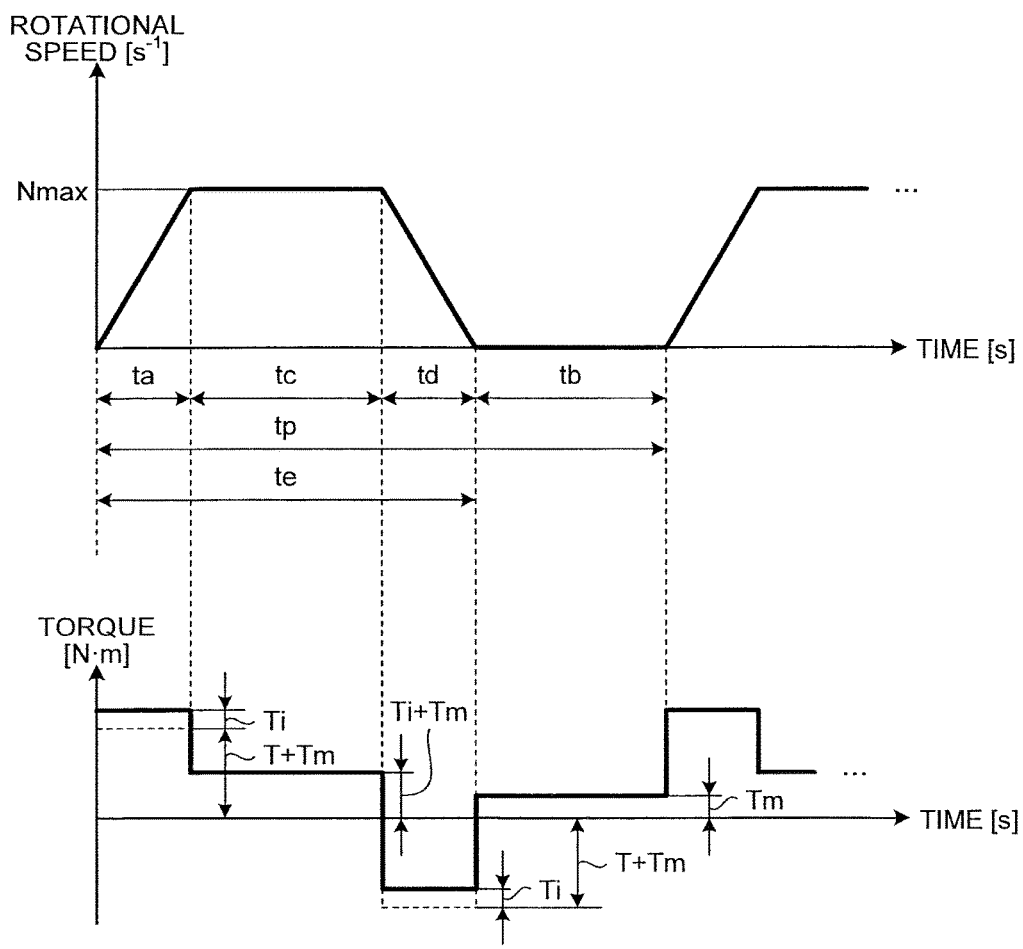
FIG. 6 is an explanatory diagram illustrating an exemplary operation pattern of a motor according to the present embodiment.

FIG. 6 is an explanatory diagram illustrating an exemplary operation pattern for the motor according to the present embodiment. According to the operation pattern illustrated in FIG. 6, the rotational speed of the motor is accelerated during acceleration time ta. Next, according to the operation pattern illustrated in FIG. 6, the rotational speed of the motor is kept at the maximum rotational speed Nmax during constant speed time tc. Then, according to the operation pattern illustrated in FIG. 6, the rotational speed of the motor is reduced and decelerated during deceleration time td. Next, according to the operation pattern illustrated in FIG. 6, the rotational speed of the motor becomes zero and the motor is stopped during stop time tb. Positioning time te is a period obtained by adding the acceleration time ta with the constant speed time tc and deceleration time td. The above-mentioned input value C12 of the requested positioning time corresponds to a value of the positioning time te. Further, the input value C13 of the required stop time corresponds to the stop time tb. Additionally, the input value C15 of the maximum rotational speed limit corresponds to the maximum rotational speed Nmax.

Figure 7:
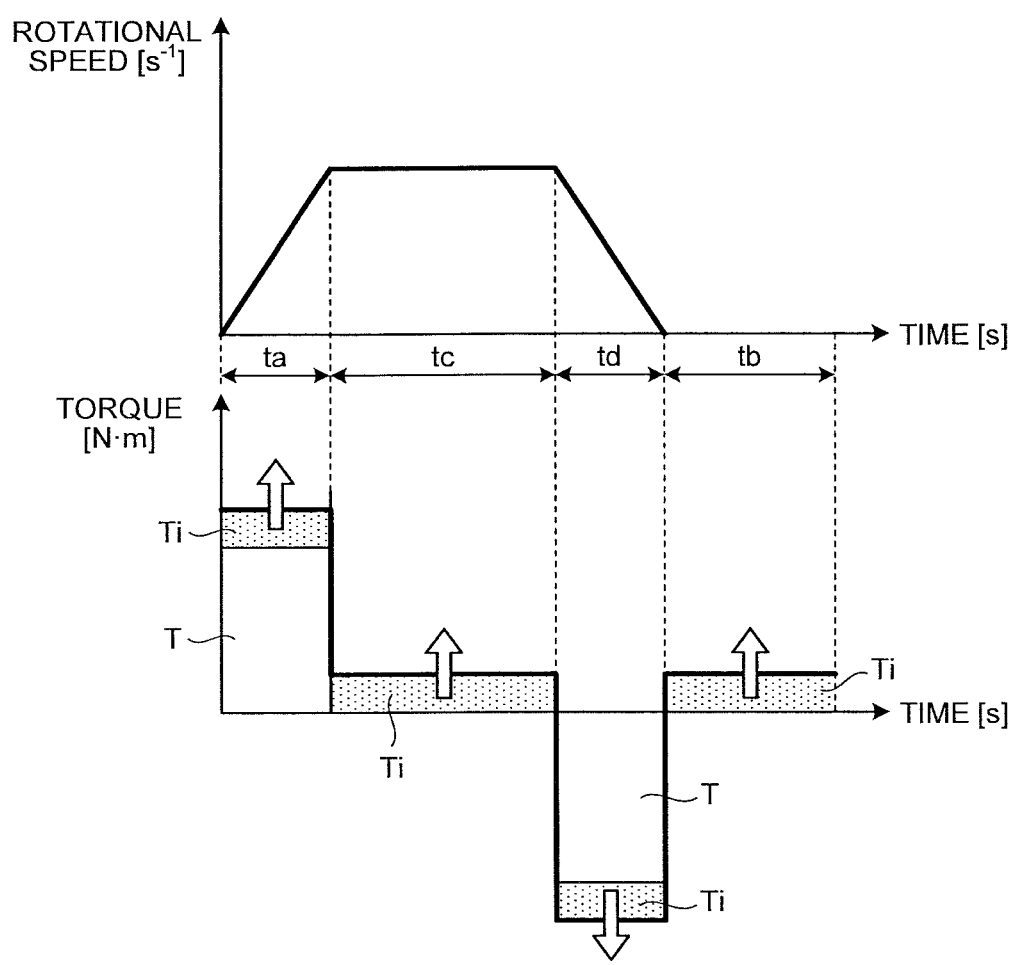
FIG. 7 is an explanatory diagram illustrating an exemplary relation between output torque in the case of having no dynamic friction torque and output torque in the case of having dynamic friction torque.
Figure 8:
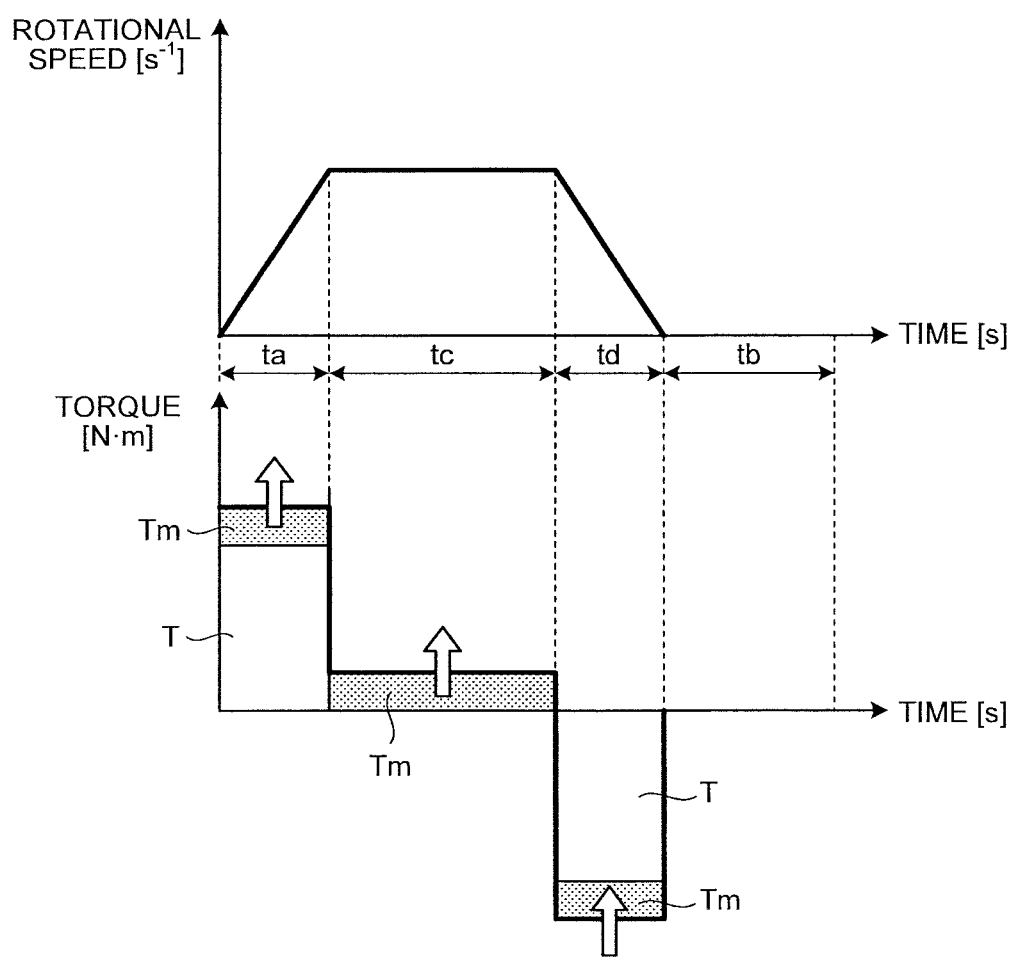
FIG. 8 is an explanatory diagram illustrating an exemplary relation between output torque in the case of having no constant load torque and output torque in the case of having constant load torque.

As the operation pattern illustrated in FIG. 6, in most cases, the direct drive motor performs positioning operation by alternately setting the positioning time to rotate the motor output shaft 21 and the stop time to stop the motor output shaft 21. According to the operation pattern illustrated in FIG. 6, different from the case where the motor is used at a constant rotational speed and constant load torque, it is necessary to consider how constant load torque Tm and dynamic friction torque Ti influence output torque in accordance with behavior of the motor at the time of calculating effective torque Te. FIG. 7 is an explanatory diagram illustrating an exemplary relation between output torque in the case of having no dynamic friction torque and output torque in the case of having dynamic friction torque. FIG. 8 is an explanatory diagram illustrating an exemplary relation between output torque in the case of having no constant load torque and output torque in the case of having constant load torque.

For example, according to Prior Art 1 described above, the dynamic friction torque Ti is added to the output torque T during normal rotation, and the dynamic friction torque Ti is subtracted from the output torque T during reverse rotation. However, considering actual physical phenomena, the dynamic friction torque Ti acts as force to interfere with rotation of the motor during the acceleration time ta and the constant speed time tc. Therefore, the effective torque Te illustrated in FIG. 6 corresponds to the period obtained by adding the acceleration time ta with the constant speed time tc and deceleration time td illustrated in FIG. 7, and is increased by an amount of the dynamic friction torque Ti. During the deceleration time td, the dynamic friction torque Ti acts as force to help stopping the motor. As a result, the effective torque Te is reduced by the amount of the dynamic friction torque Ti. Further, as illustrated in FIG. 8, it can be understood that the constant load torque Tm constantly acts on a side where torque is constantly increased regardless of behavior of the motor.

As illustrated in FIG. 5, the above-described input value C14 of the torque limit is a ratio of limiting the maximum output torque, and is a percentage figure in the case of assuming that the maximum output torque is 100, for example. More specifically, in the case where the motor has the maximum torque of 100 N and the input value C14 of the torque limit is 70(%), the CPU 14c executes simulation under the maximum torque of 70 N. By thus limiting the maximum torque, there may be a case where the positioning time te is elongated while a cycle period tp obtained by adding the positioning time te with the stop time tb can be shortened. Further, the input value C22 of the load torque (constant) corresponds to the constant load torque Tm. Further, the input value C23 of the dynamic friction torque corresponds to a value of the dynamic friction torque Ti.

Therefore, the CPU 14c reads the input value C11 of the positioning angle, input value C12 of the required positioning time, input value C13 of the required stop time, input value C14 of the torque limit, and input value C15 of the maximum rotational speed limit, which are input from the input device 12 to store the values C11 to C15 in the external storage device 15 or the internal storage device 14f. In the same manner, the CPU 14c of the control device 11 reads the input value C21 of the inertia moment of the load, input value C22 of the load torque (constant), and input value C23 of the dynamic friction torque, to store in the external storage device 15 or the internal storage device 14f.

As described above, in the case where the torque during the acceleration time to in the operation pattern illustrated in FIG. 6 is set at torque Ta, the torque Ta is calculated by a formula (1) below in the CPU 14c.

$$Ta = T + Tm + Ti \quad (1)$$

Further, in the case where the torque during the constant speed time tc in the operation pattern illustrated in FIG. 6 is set at torque Tc, the torque Tc is calculated by a formula (2) below in the CPU 14c.

$$Tc = Tm + Ti \quad (2)$$

Further, in the case where the torque during the deceleration time td in the operation pattern illustrated in FIG. 6 is set at torque Td, the torque Td is calculated by a formula (3) below in the CPU 14c.

$$Td = T + Tm - Ti \quad (3)$$

Further, in the case where the torque during the stop time tb in the operation pattern illustrated in FIG. 6 is set at torque Tb, the torque Tb is calculated by a formula (4) below in the CPU 14c. Note that the torque Tb is the torque to keep a stopped position during the stop time tb.

$$Tb = Tm \quad (4)$$

FIG. 9 is an explanatory diagram illustrating an exemplary flowchart to calculate an operation pattern for a motor according to the present embodiment. FIG. 10 is an explanatory diagram illustrating an exemplary motor database storing mechanical elements data information for each of the selectable motors according to the present embodiment. The CPU 14c can calculate, for each to the motors, the acceleration time ta, constant speed time tc, and deceleration time td by the flowchart illustrated in FIG. 9 based on the above-described input value C21 of the inertia moment of the load, input value C11 of the positioning angle, and information of at least the rotor inertia moment and the rotational speed-torque characteristic (N-T characteristic) among the mechanical elements data information DB.

As illustrated in FIG. 9, the CPU 14c reads the information of the mechanical elements data information for each of the selectable motor described above (Step S81). The mechanical elements data information DB illustrated in FIG. 10 includes, for each call number (motor index) of each of the selectable motors listed in a column BN, information including, for example, rotor inertia moment information DJI, rotational speed-torque characteristic (N-T characteristic) information DNT, rated torque information DRT, seal friction torque information DST, maximum rotational speed (maximum rotational angular speed) information DNmax, break point speed (or rotational speed) information Dbk, and maximum output torque information DMT which are linked one another. In the mechanical elements data information DB of the present embodiment, torque characteristic information DNTK related to a coefficient a and a coefficient b, which indicate later-described torque characteristics of torque decrease after the break point, is linked to and stored in the column BN for the call number (motor index) of each of the selectable motors in the case where there is a break point where torque is decreased by the rotational angular speed of rotation of the motor output shaft in the torque characteristic information (N-T characteristic) DNT. The CPU 14c may obtain, on a case-by-case basis, the torque characteristic information DNTK by performing calculation from the rotational speed-torque characteristic (N-T characteristic) information DNT. Note that the mechanical elements data information DB illustrated in FIG. 10 includes a column BS to store information of series names of the selectable motors grouped by types in the column BN.

Figure 11:
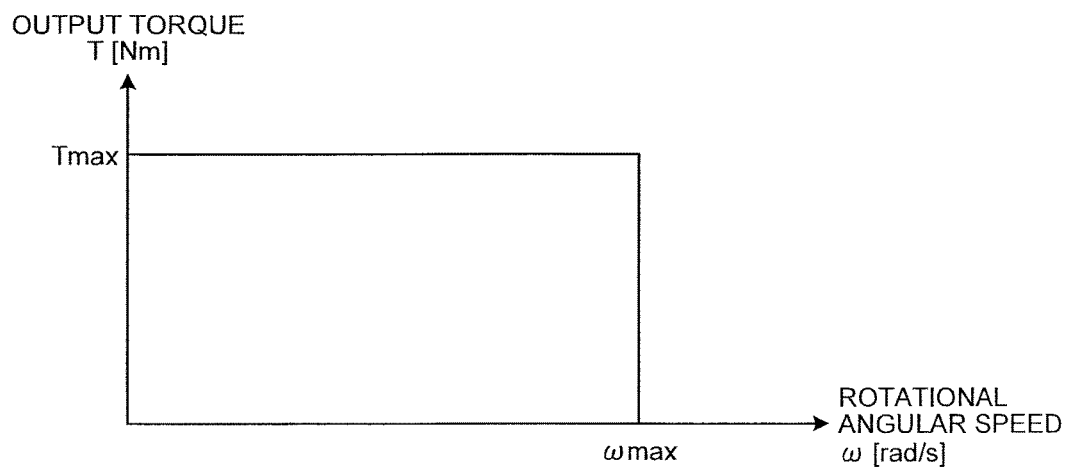
FIG. 11 is an explanatory diagram illustrating first torque characteristic information (N-T characteristic) in the motor according to the present embodiment.
Figure 12:
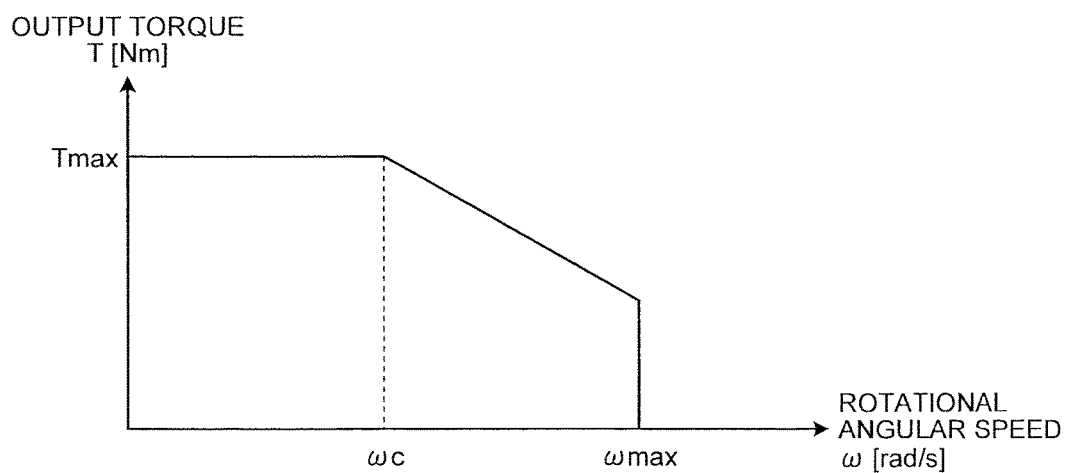
FIG. 12 is an explanatory diagram illustrating second torque characteristic information (N-T characteristic) in the motor according to the present embodiment.
Figure 13:
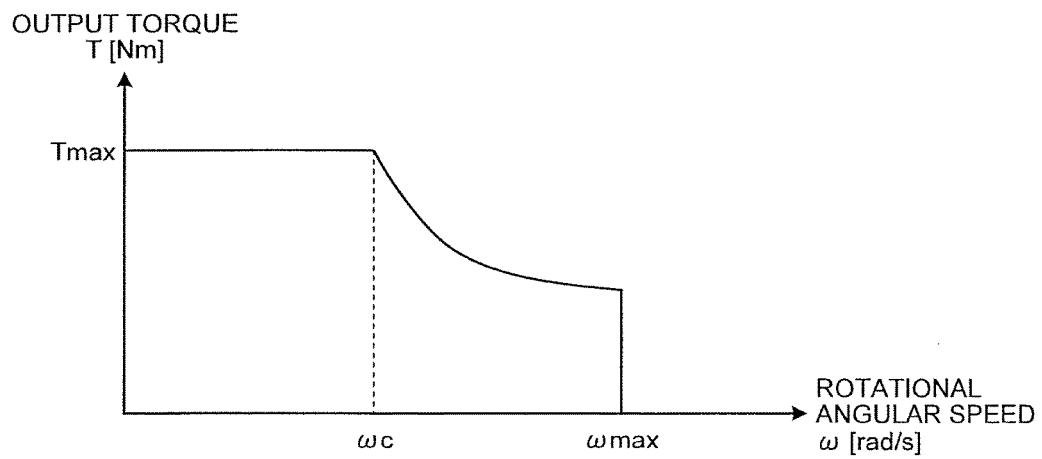
FIG. 13 is an explanatory diagram illustrating third torque characteristic information (N-T characteristic) in the motor according to the present embodiment.

Further, the CPU 14c calculates, as the information of the simulation conditions, the acceleration time ta, constant speed time tb, and deceleration time td, which are to be the positioning time, based on the input value C21 of the inertia moment of the load, input value C11 of the positioning angle, and the mechanical elements data information DB. FIG. 11 is an explanatory diagram illustrating first torque characteristic information (N-T characteristic) in the motor according to the present embodiment. FIG. 12 is an explanatory diagram illustrating second torque characteristic information (N-T characteristic) in the motor according to the present embodiment. FIG. 13 is an explanatory diagram illustrating third torque characteristic information (N-T characteristic) in the motor according to the present embodiment. In the following, a calculation example in the CPU 14c will be described by exemplifying the first torque characteristic information (N-T characteristic), second torque characteristic information (N-T characteristic), and third torque characteristic information (N-T characteristic) illustrated in FIGS. 11, 12, and 13, but note that the present embodiment is not limited to this calculation example. Further, according to the present embodiment, the calculation example is provided under the condition that the acceleration time ta is equal to the deceleration time td in order to reduce a calculation load. However, calculation may be performed such that the acceleration time ta differs from the deceleration time td.

The rotational speed-torque characteristic (N-T characteristic) is torque information relative to the rotational speed of each of the stored motors, and includes the same characteristic as the rotational angular speed-torque characteristic because the rotational angular speed ω is 2πN obtained by multiplying the rotational speed N by 2π. In the case where the stored mechanical elements data information DB includes the rotational speed-torque characteristic (N-T characteristic), the CPU 14c calculates the information of the rotational speed as the rotational angular speed, and can obtain the torque information (rotational angular speed-torque characteristic) relative to the rotational angular speed as illustrated in FIGS. 11, 12, and 13. In the case where the stored mechanical elements data information DB includes the rotational angular speed-torque characteristic, the CPU 14c can directly read, from the storage unit, the rotational angular speed-torque characteristic information illustrated in FIGS. 11, 12, and 13. In the case where the mechanical elements data information DB includes the information DNmax of the maximum rotational speed Nmax, the CPU 14c sets, as the maximum rotational angular speed ωmax, 2πNmax obtained by multiplying 2π by the information of maximum rotational speed Nmax. Otherwise, in the case where the mechanical elements data information DB includes the information of maximum rotational angular speed ωmax, the CPU 14c can directly read, from the storage unit, the information of maximum rotational angular speed ωmax. In the case where the mechanical elements data information DB does not include the information of maximum rotational speed Nmax, the CPU 14c obtains the information of the maximum rotational speed Nmax from the information of rotational speed-torque characteristic (N-T characteristic), and may set, as the maximum rotational angular speed ωmax, 2πNmax obtained by multiplying 2π by the maximum rotational speed Nmax.

(First Torque Characteristic Information (N-T Characteristic))

For example, in the case of the first torque characteristic information (N-T characteristic) in which the rotational speed-torque characteristic (N-T characteristic) of a motor to be selected has torque which is constant to the rotational speed (Step S82, Yes), the CPU 14c calculates the acceleration time ta, constant speed time tb, and deceleration time td for each of the motors. Further, the CPU 14c calculates the positioning time to as a total value of the acceleration time ta, constant speed time tb, and deceleration time td.

As illustrated in FIG. 11, in the first torque characteristic information (N-T characteristic), where a horizontal axis represents the rotational angular speed and a vertical axis represents the output torque, there is no break point where the torque decreases in relation to the rotational angular speed of rotation of the motor output shaft. As for the CPU 14c, the CPU 14c determines the read rotational speed-torque characteristic (N-T characteristic) of the motor as the first torque characteristic information (N-T characteristic) in the case where the mechanical elements data information DB does not include information of the break point speed, or in the case where there is no break point based on the break point information Dbk. Since there is no break point in the first torque characteristic information (N-T characteristic), the output torque T is constant regardless of the speed of the motor output shaft in the case where the rotational angular speed ω of the motor output shaft is within an area where the rotational angular speed ranges from zero to the maximum rotational angular speed ωmax (rad/s).

The CPU 14c calculates a total value J (kg·m²) obtained by adding the rotor inertia moment included in the mechanical elements data information DB with the received input value C21 of the inertia moment of the load. In the CPU 14c, in the case where rotation angular acceleration is α (rad/s²), a relation between the mentioned total value J (kg·m²) and the output torque T establishes a formula (5) below based on a motion equation.

$$T = \alpha \times J \tag{5}$$

The rotation angular acceleration a can be obtained as shown in a formula (6) based on the formula (5).

$$\alpha = \frac{T}{J} \tag{6}$$

Since constant angular acceleration is assumed in the simulation of the present embodiment, the rotational angular speed ω is expressed as shown in a formula (7) below.

$$\omega = \alpha \times ta \tag{7}$$

According to the present embodiment, the first torque characteristic information (N-T characteristic) has the torque which is constant relative to the rotational angular speed. For example, the constant speed time tc is set at zero in order to minimize the positioning time to under the condition that the acceleration time ta is equal to the deceleration time td. Therefore, in the case of setting the input value C11 of the positioning angle at θ, the angle θ (rad) can be calculated by a formula (8) below.

$$\theta = \omega ta = \alpha \times ta^2 \tag{8}$$

Therefore, the acceleration time ta can be calculated as shown in a formula (9) based on the formulas (8) and (6).

$$ta = \sqrt{\frac{\theta}{\alpha}} = \sqrt{\frac{J\theta}{T}} \tag{9}$$

In the case of acquiring the positioning time te under the condition that the acceleration time ta is equal to the deceleration time td, the positioning time te can be obtained from calculation of a formula (10) below.

$$te = 2ta = 2\sqrt{\frac{J\theta}{T}} \tag{10}$$

As described above, the CPU 14c calculates, in a simulation step (Step S4), the total value J of the inertia moment by adding the rotor inertia moment DJI of the mechanical elements data information DB with the input value C21 of the inertia moment of the load. Further, the CPU 14c calculates shortest positioning time to rotate a load by the input value C11 of the positioning angle θ based on the total value J of the inertia moment and the torque characteristic information DNT according to the rotational angular speed or the rotational speed included in the mechanical elements data information DB. By this, an operation pattern that can shorten a cycle time by minimizing time to complete positioning can be simulated. In the case where the torque characteristic information DNT according to the rotational angular speed or the rotational speed of the stored motor has the constant output torque T while rotation of the output shaft is varied from zero to a maximum rotational angular speed or a maximum rotational speed, the CPU 14c simulates an operation pattern such that rotation by the positioning angle θ is performed by rotation of the output shaft during the acceleration time ta in which rotation of the motor output shaft is accelerated and the deceleration time td in which rotation of the motor output shaft is decelerated. Then, the CPU 14c calculates the acceleration time ta and the deceleration time td by the formula (9) for each call number (motor index) of each of the selectable motors in the column BN. The calculated values of the acceleration time ta and the deceleration time td are stored in the external storage device 15 or the internal storage device 14f, and the constant speed time tc is stored as zero in the external storage device 15 or the internal storage device 14f (Step S83). After that, the CPU 14c advances the processing to Step S87 after Step S83.

For example, in the case where the rotational speed-torque characteristic (N-T characteristic) of the motor to be selected has the torque not constant relative to the rotational speed (Step S82, No), the CPU 14c advances the processing to Step S84 and performs calculation in accordance with calculation procedures for the second torque characteristic (N-T characteristic) or the third torque characteristic (N-T characteristic). As illustrated in FIGS. 12 and 13, in the second torque characteristic information (N-T characteristic) and the third torque characteristic information (N-T characteristic), a horizontal axis represents the rotational angular speed and a vertical axis represents the output torque, and there is a break point ωc which is a change point where the torque is decreased by a certain speed of the motor output shaft. As for the CPU 14c, in the case where there is the break point ωc, the CPU 14c determines, based on the break point information Dbk, a torque characteristic (N-T characteristic) relative to the read rotational speed of the motor as the second torque characteristic information (N-T characteristic) or the third torque characteristic information (N-T characteristic).

(Second Torque Characteristic Information (N-T Characteristic))

In the case where the torque characteristic information according to the rotational angular speed or the rotational speed of the stored motor has a break point which is a change point where the output torque is reduced while rotation of the output shaft is varied from zero to the maximum rotational angular speed or varied from zero to the maximum rotational speed, calculation of the positioning time te is changed depending on whether the rotational angular speed calculated by the above-described formula (7) is in a first area or a second area. The first area is a range where the rotational angular speed reaches the break point, and the second area where the rotational angular speed is varied from the break point to the maximum rotational angular speed. In the case where the rotational angular speed calculated by the above-described formula (7) is in the first area where the rotational angular speed reaches the break point of the rotational angular speed, the positioning time te can be obtained by performing calculation of the above-described formula (10) by the CPU 14c same as the calculation in the first torque characteristic information (N-T characteristic). In the following, a description will be given for calculation of the positioning time te executed by the CPU 14c in the case where the rotational angular speed calculated by the above-described formula (7) is in the second area, using FIG. 12. The second torque characteristic information (N-T characteristic) illustrated in FIG. 12 has the constant output torque T in the case where the rotational angular speed ω of the motor output shaft is in the first area where the rotational angular speed ω is zero or more and rotational angular speed ωc (rad/s) of the break point or less. Further, in the case where the second torque characteristic information (N-T characteristic) illustrated in FIG. 12 has the output torque T that is reduced due to relation of a linear function represented by a formula (11) although the rotational angular speed ω is increased (Step S84, Yes) when the rotational angular speed ω of the motor output shaft is in the second area where the rotational angular speed ω of the motor output shaft exceeds the rotational angular speed ωc (rad/s) of the break point and becomes the maximum rotational angular speed ωmax (rad/s) or less, the CPU 14c calculates the positioning time to in the second area of the second torque characteristic information (N-T characteristic).

$$T = a\omega + b \tag{11}$$

The coefficient a and the coefficient b shown in the formula (11) correspond to information read by the CPU 14c from the mechanical elements data information DB, and are real numbers other than zero. Note that the output torque T decreases by the relation of the linear function shown in the formula (11) although the rotational angular speed ω is increased because the coefficient α is negative.

The rotation angular acceleration a can be obtained by a formula (12) from the formulas (11) and (5).

$$\alpha = \frac{b}{(J - a \times ta)} \tag{12}$$

The angle θ[rad] is a value obtained by integrating the rotational angular speed ω with respect to time. Since the calculation load is reduced by assuming that the acceleration time to is equal to the deceleration time td, the angle θ can be obtained by a formula (13) below based on the above formula (7).

$$\theta = \omega(ta + tc) = \alpha \times ta(ta + tc) = \alpha \times ta^2 + \alpha \times ta \times tc \tag{13}$$

In the case of sorting out the formula (13) by the constant speed time tc, a formula (14) can be obtained.

$$tc = \frac{\theta}{\alpha \times ta} - ta \tag{14}$$

The positioning time te is the period obtained by adding the acceleration time ta with the constant speed time tc and deceleration time td. The calculation load decreases by assuming that the acceleration time ta is equal to the deceleration time td, and the positioning time te can be obtained by a function of the acceleration time ta as shown in a formula (15).

$$te = ta + tc + td = 2ta + tc = ta + \frac{\theta}{\alpha \times ta} = ta + \frac{J\theta}{b \times ta} - \frac{a \times \theta}{b} \quad (15)$$

To minimize the positioning time te, the CPU 14c differentiates the function of the acceleration time ta shown in the formula (15) with respect to the acceleration time ta, and a positive extreme value of the acceleration time ta can be obtained by a formula (16) in the case of zero.

$$ta = \sqrt{\frac{J\theta}{b}} \quad (16)$$

As described above, the CPU 14c obtains the acceleration time ta and the constant speed time tc in the case where the rotational angular speed ω is in the second area, and stores the acceleration time ta and the constant speed time tc in the external storage device 15 or the internal storage device 14f. Further, the CPU 14c calculates the positioning time in the second area as an summation value obtained by adding the constant speed time tc with doubled acceleration time ta, and stores the positioning time in the external storage device 15 or the internal storage device 14f.

In the case where the rotational angular speed ω is in the first area, as is the case with the first torque characteristic information (N-T characteristic), the CPU 14c calculates the acceleration time ta and the deceleration time td by the formula (9), and stores the calculated values of the acceleration time ta and the deceleration time td in the external storage device 15 or the internal storage device 14f, and stores the value zero as the constant speed time tc in the external storage device 15 or the internal storage device 14f. The CPU 14c calculates the positioning time in the first area by the formula (10), and stores the positioning time in the external storage device 15 or the internal storage device 14f. Meanwhile, in the case of the first area of the present embodiment, the second torque characteristic information (N-T characteristic) illustrated in FIG. 12 has the constant output torque T, but not limited thereto, the output torque T may have characteristic of being increased while rotation of the output shaft is varied from zero to the break point ωc.

The CPU 14c stores, in the external storage device 15 or the internal storage device 14f, the acceleration time ta, constant speed time tc, and deceleration time td which determine the positioning time to out of the positioning time in the first area and the positioning time in the second area (Step S85). After that, the CPU 14c advances the processing to Step S87 from Step S85. Thus, the CPU 14c can perform simulation such that rotation by the positioning angle θ is performed by rotation of the output shaft during the acceleration time ta, constant speed time tc, and deceleration time td (=ta) in the second area where rotational angular speed is varied from the break point ωc up to the maximum rotational angular speed ωmax.

(Third Torque Characteristic Information (N-T Characteristic))

In the case where the torque characteristic information according to the rotational angular speed or the rotational speed of the stored motor has a break point which is the change point where the output torque decreases while rotation of the output shaft is varied from zero to the maximum rotational angular speed or varied from zero to the maximum rotational speed, calculation of the positioning time te is changed depending on whether the rotational angular speed calculated by the above-described formula (7) is in the first area or the second area. The first area is a range where the rotational angular speed reaches the break point, and the second area where the rotational angular speed is varied from the break point to the maximum rotational angular speed. In the case where the rotational angular speed calculated by the above-described formula (7) is in the first area where the rotational angular speed reaches the break point of the rotational angular speed, the positioning time te can be obtained by performing calculation of the above-described formula (10) by the CPU 14c same as the calculation in the first torque characteristic information (N-T characteristic). In the following, a description will be given for calculation of the positioning time te executed by the CPU 14c in the case where the rotational angular speed calculated by the above-described formula (7) is in the second area, using FIG. 13. The third torque characteristic information (N-T characteristic) illustrated in FIG. 13 has the constant output torque T in the case where the rotational angular speed ω of the motor output shaft is in the first area where the rotational angular speed ω is zero or more and rotational angular speed ωc (rad/s) of the break point or less. Further, in the case where the third torque characteristic information (N-T characteristic) illustrated in FIG. 13 has the output torque T that decreases due to a relation of an $n^{th}$-degree function (n is a value larger than 1) although the rotational angular speed ω is increased (Step S84, No), when the rotational angular speed ω of the motor output shaft is in the second area where the rotational angular speed exceeds the rotational angular speed ωc (rad/s) of the break point and is varied to the maximum rotational angular speed ωmax (rad/s) or less, the CPU 14c calculates the positioning time to of the motor in the second area of the third torque characteristic information (N-T characteristic).

In the case where the rotational angular speed ω is in the second area where the rotational angular speed ω exceeds the rotational angular speed ωc (rad/s) of the break point and is varied to the maximum rotational angular speed ωmax (rad/s) or less, the third torque characteristic information (N-T characteristic) has the output torque decreasing due to the relation of the $n^{th}$-degree function (n is the value larger than 1) although the rotational angular speed ω is increased. The CPU 14c can perform either one or both of a first calculation procedure and a second calculation procedure: the first calculation procedure is to perform linear approximation in which the $n^{th}$-degree function is linearly approximated, and the second calculation procedure is to calculate the shortest positioning time to minimize the positioning time by dividing the second area into a plurality of sections by a predetermined rotational angular speed, and calculating the positioning time for each of the sections of the rotational angular speed.

(First Calculation Procedure)

Figure 14:
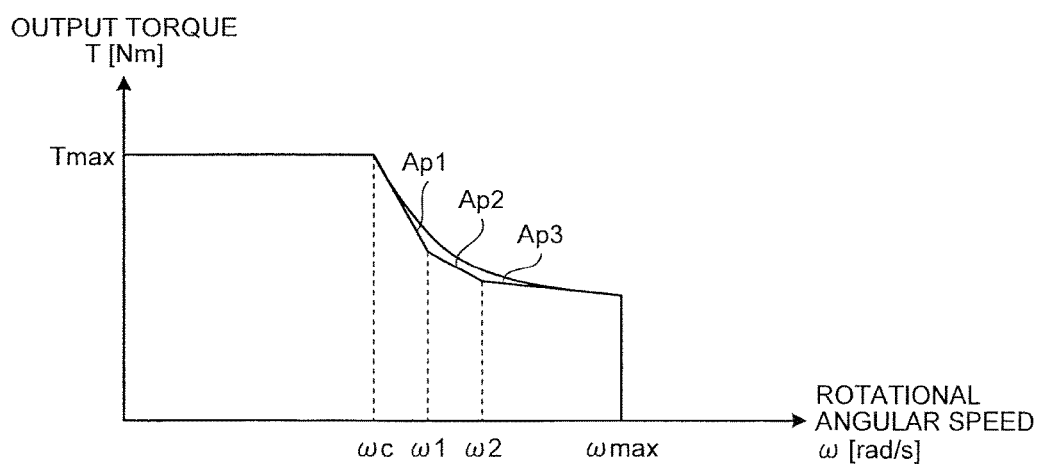
FIG. 14 is an explanatory diagram illustrating an approximate formula to obtain shortest positioning time by approximating the third torque characteristic information (N-T characteristic) illustrated in FIG. 13.

FIG. 14 is an explanatory diagram illustrating an approximate formula to obtain the shortest positioning time by approximating the third torque characteristic information (N-T characteristic) illustrated in FIG. 13. The CPU 14c approximates an $n^{th}$-degree curve in the second area by approximate curves Ap1, Ap2, and Ap3 which are plural linear functions (herein after referred to as approximate straight lines). The approximate straight lines Ap1, Ap2, and Ap3 have the coefficients a and coefficients b which are different from one other. The coefficient a of each of the approximate straight lines Ap1, Ap2, and Ap3 have an inclination larger than a tangent line when the rotational angular speed ω is in the $n^{th}$-degree curve in one of the areas in the second area corresponding to the respective approximate straight lines Ap1, Ap2, and Ap3. In other words, preferably, the coefficient a of each of the approximate straight lines Ap1, Ap2, and Ap3 is smaller than the tangent line when the rotational angular speed ω is in the $n^{th}$-degree curve in one of the areas in the second area corresponding to the respective straight lines Ap1, Ap2, and Ap3. By this, the approximate straight lines Ap1, Ap2, and Ap3 are made smaller than the actual $n^{th}$-degree curve, and it is possible to reduce a possibility of calculating a torque which cannot be output from the motor being calculated.

As described above, in the case where the rotational angular speed ω is in each of the approximate straight lines Ap1, Ap2, and Ap3 in the second area, the CPU 14c obtains the acceleration time ta and constant speed time tc based on the above-described formulas (14) and (16), and stores the acceleration time ta and constant speed time tc in the external storage device 15 or the internal storage device 14f. Further, in the case where the rotational angular speed ω is in each of the approximate straight lines Ap1, Ap2, and Ap3 in the second area, the CPU 14c calculates plural positioning time for each of the cases as the summation value obtained by adding the constant speed time tc with the doubled acceleration time ta, and stores the summation value in the external storage device 15 or the internal storage device 14f. Thus, the CPU 14c can obtain the shortest positioning time from among the positioning time te calculated for each of the sections obtained by dividing the second area into the plurality of sections. The positioning time te is the period in which the motor output shaft is rotated at the rotational angular speed in the second area where the rotational angular speed is varied from the break point up to the maximum rotational angular speed.

In the case where the rotational angular speed ω is in the first area, as is the case with the first torque characteristic information (N-T characteristic), the CPU 14c calculates the acceleration time ta and the deceleration time td by the formula (9), and stores the calculated values of the acceleration time ta and the deceleration time td in the external storage device 15 or the internal storage device 14f, and stores the value zero as the constant speed time tc in the external storage device 15 or the internal storage device 14f. The CPU 14c calculates the positioning time in the first area by the formula (10), and stores the positioning time in the external storage device 15 or the internal storage device 14f.

The CPU 14c stores, in the external storage device 15 or the internal storage device 14f, the acceleration time ta, constant speed time tc, and deceleration time td determined as the positioning time to out of the positioning time in the first area and the positioning time in the second area (Step S86). After that, the CPU 14c advances the processing to Step S87 from Step S86. Thus, the CPU 14c can perform simulation such that rotation by the positioning angle θ is performed by rotation of the output shaft during the acceleration time ta, constant speed time tc, and deceleration time td (=ta) in the second area where rotational angular speed is varied from the break point ωc up to the maximum rotational angular speed ωmax.

(Second Calculation Procedure)

Figure 15:
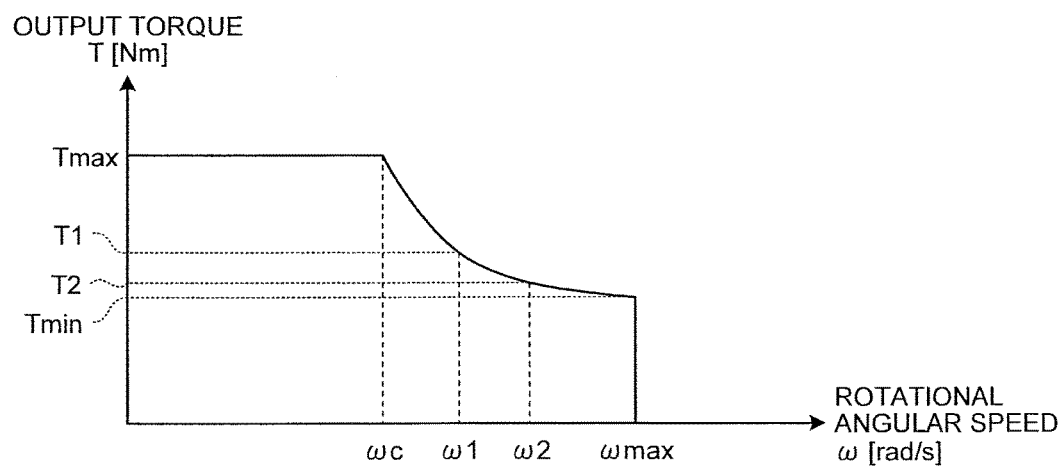
FIG. 15 is an explanatory diagram illustrating the third torque characteristic information (N-T characteristic) illustrated in FIG. 13 to describe divisions of rotational angular speed to acquire output torque according to the speed.

FIG. 15 is an explanatory diagram illustrating the third torque characteristic information (N-T characteristic) illustrated in FIG. 13 to describe divisions of rotational angular speed to acquire output torque according to the speed. The CPU 14c provides a plurality of rotational angular speeds ω1, ω2 at the $n^{th}$-degree curve in the second area, and calculates corresponding output torque T1, T2. The rotational angular speeds ω1, ω2 exceed the rotational angular speed ωc (rad/s) at the break point and equal to or less than the maximum rotational angular speed ωmax (rad/s). Note that the output torque T at the maximum rotational angular speed ωmax becomes the smallest value Tmin.

The CPU 14c calculates the output torque T1 at the rotational angular speed ω1 based on the above-described formula (6). The acceleration time ta at this point can be acquired as ω1×J/T1 based on the above-described formula (6). Further, tc is acquired as θ/ω1−ta based on the above-described formula (14). Positioning time te is a period obtained by adding the acceleration time ta with the constant speed time tc and deceleration time td. When the calculation load is reduced by assuming that the acceleration time ta is equal to the deceleration time td, the positioning time te is to be (ω1×J/T1+θ/ω1). The CPU 14c acquires the positioning time te at the rotational angular speed ω1, and stores the result in the external storage device 15 or the internal storage device 14f. In the same manner, the CPU 14c calculates the output torque T2 at the rotational angular speed ω2 based on the above-described formula (6). The acceleration time ta at this point is acquired as ω2×J/T2 based on the above-described formula (6). Further, the constant speed time tc is θ/ω2−ta based on the above-described formula (14). Positioning time te is a period obtained by adding the acceleration time ta with the constant speed time tc and deceleration time td. When the calculation load is reduced by assuming that the acceleration time ta is equal to the deceleration time td, the positioning time te is to be (ω2×J/T2+θ/ω2). The CPU 14c acquires the positioning time te at the rotational angular speed ω2, and stores the result in the external storage device 15 or the internal storage device 14f. The positioning time te during which the motor output shaft is rotated at the rotational angular speed in the second area where the rotational angular speed is varied from the break point ωc up to the maximum rotational angular speed is the shortest positioning time among the positioning time te calculated for each of the sections obtained by dividing the second area into the plurality of rotational angular speeds ω1, ω2. According to the embodiment, the description has been given by exemplifying the two rotational angular speeds ω1, ω2, but the number of divided sections is not limited as far as the positioning time te is calculated for three or more rotational angular speeds to obtain conditions to be a minimum value.

The CPU 14c stores, in the external storage device 15 or the internal storage device 14f, the acceleration time ta, constant speed time tc, and deceleration time td determined as the positioning time te out of the positioning time in the second area (Step S86). After that, the CPU 14c advances the processing to Step S87 from Step S86.

The CPU 14c stores, in the external storage device 15 or the internal storage device 14f, the acceleration time ta, constant speed time tc, and deceleration time td determined as the positioning time te out of the positioning time in the first area and the positioning time in the second area (Step S86). After that, the CPU 14c advances the processing to Step S87 from Step S86. Thus, the CPU 14c can perform simulation such that rotation by the positioning angle θ is performed by rotation of the output shaft during the acceleration time ta, constant speed time tc, and deceleration time td (=ta) in the second area where rotational angular speed is varied from the break point ωc up to the maximum rotational angular speed ωmax.

In the case of performing the processing by the above-described first calculation procedure, the CPU 14c can reduce a calculation load more than in the case of performing the processing by the second calculation procedure. In the case of performing the processing by the above-described second calculation procedure, the CPU 14c can improve accuracy of a value of the positioning time te more than in the case of performing the processing by the first calculation procedure.

The selected motor is needed to be operated such that the effective torque Te during the cycle period tp becomes the rated torque Tr or less determined for each motor. Therefore, the stop time tb for the acceleration time ta, constant speed time tc, and deceleration time td which are for the shortest positioning time te, becomes shortest in the case where the effective torque Te is equal to the rated torque Tr, and the CPU 14c can calculate the stop time tb by a formula (17) below (Step S87). However, in the case where the stop time tb which is a calculation result of the formula (17) is negative (tb<0), the CPU 14c stores the stop time tb as 0 (tb=0) in the external storage device 15 or the internal storage device 14f.

$$tb = \frac{ta\{Ta^2 - Tr^2\} + tc\{Tc^2 - Tr^2\} + td\{Td^2 - Tr^2\}}{Tr^2 + Tb^2} \quad (17)$$

Further, in the case where the torque in the cycle period tp obtained by adding the positioning time te with the stop time tb is set as the effective torque Te, the CPU 14c calculates the effective torque Te by a formula (18) below. The CPU 14c calculates the effective torque Te by providing the formula (18) below with the obtained torque Ta, Tc, Td, and Tb, acceleration time ta, constant speed time tc, deceleration time td, and stop time tb.

$$Te = \sqrt{\frac{ta \times Ta^2 + tc \times Tc^2 + td \times Td^2 + tb \times Tb^2}{tp}} \quad (18)$$

The motor selection device 1 can calculate the effective torque Te approximate to an actual state with the operation pattern, constant load torque, and dynamic friction torque.

Figure 16:
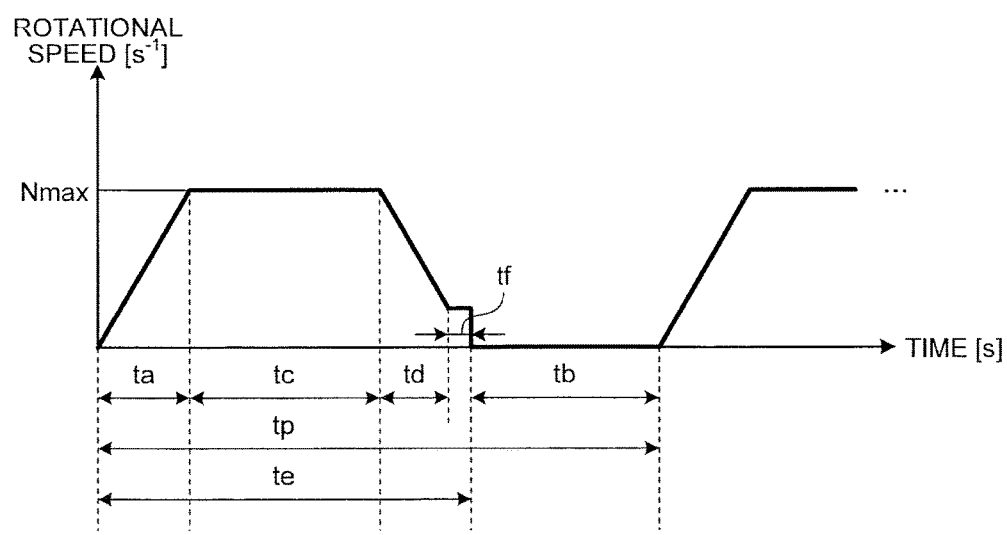
FIG. 16 is an explanatory diagram illustrating another example of the operation pattern for a motor according to the present embodiment.
Figures 17, 18:
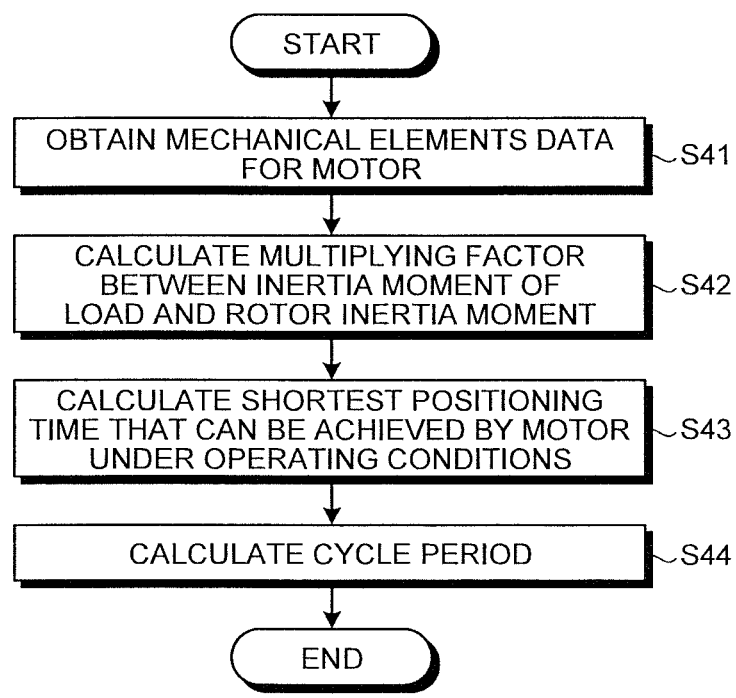
FIG. 17 is an explanatory diagram illustrating another example of an input screen of the motor selection device according to the present embodiment.
FIG. 18 is a flowchart illustrating an operation pattern simulation step to simulate an operation pattern for a motor.

FIG. 16 is an explanatory diagram illustrating another example of the operation pattern for the motor according to the present embodiment. FIG. 17 is an explanatory diagram illustrating another example of an input screen of the motor selection device according to the present embodiment. In the operation pattern illustrated in FIG. 16, settling time tf is secured between the deceleration time td and stop time tb in addition to the deceleration time td. The settling time tf is a period from when a command of the positioning time to for the motor is completed until when positioning is performed constantly within a repeated positioning accuracy range. For example, the CPU 14c of the control device 11 adds, to the input screen G1, a box B4 for an additional condition, and receives a choice of any one of check boxes R1 to R3 as an input value of each of settling time tf in the Box B4 illustrated in FIG. 17 out of the simulation conditions input from the input device 12.

Next, as illustrated in FIG. 4, the CPU 14c of the control device 11 advances the processing to Step S2 by an execution command of an execution button B3 on the input screen G1 input from the input device 12, and determines whether the input value C11 of the positioning angle and the input value C21 of the inertia moment of the load are stored in the external storage device 15 or the internal storage device 14f as operating conditions. In the case where the operating conditions are not input (Step S2, No), the CPU 14c of the control device 11 commands the display device 13 to display an error, and returns the processing to Step S1. In the case where the operation conditions are input (Step S2, Yes), the CPU 14c of the control device 11 advances the processing to Step S3.

Next, as illustrated in FIG. 4, the CPU 14c of the control device 11 determines whether at least the input value C12 of the required positioning time is stored in the external storage device 15 or the internal storage device 14f as a required condition. In the case where the required condition is not input (Step S3, No), the CPU 14c of the control device 11 commands the display device 13 to display an error, and returns the processing to Step S1. In the case where the required condition is input (Step S3, Yes), the CPU 14c of the control device 11 advances the processing to Step S4.

The required condition of the present embodiment is the input value C12 of the required positioning time. As the required condition, at least one or more of the input value C12 of the required positioning time and the input value C13 of the required stop time are needed to be input and stored in the external storage device 15 or the internal storage device 14f as the required conditions. When at least one or more of the input value C12 of the required positioning time and the input value C13 of the required stop time are input and stored in the external storage device 15 or the internal storage device 14f as the required conditions, at least one or more of the input value C14 of the torque limit, input value C15 of the maximum rotational speed limit, input value C22 of the load torque (constant), and input value C23 of the dynamic friction torque may be further input and stored in the external storage device 15 or the internal storage device 14f.

Next, the CPU 14c of the control device 11 executes, each of the stored motors, the simulation step to simulate the operation pattern under the above-described simulation conditions for (Step S4). FIG. 18 is a flowchart illustrating the simulation step of the operation pattern to simulate the operation pattern for a motor. As illustrated in FIG. 18, the CPU 14c of the control device 11 reads the mechanical elements data information DB for the motor stored in the external storage device 15 or the internal storage device 14f, and stores and holds the information in the RAM 14e (Step S41).

Next, the CPU 14c of the control device 11 calculates a multiplying factor between the inertia moment of the load and the rotor inertia moment based on the input value C21 of the inertia moment of the load and the rotor inertia moment read in Step S41 (Step S42).

Next, the CPU 14c of the control device 11 calculates the shortest positioning time which is the shortest positioning time which can be achieved by the motor, based on the values obtained in Step S42, the input value C11 of the positioning angle as the operating condition, and the rotational speed-torque characteristic (N-T characteristic) (Step S43). In Step S43, as described above, the CPU 14c can calculate, for each of the motor, the acceleration time ta, constant speed time tc, deceleration time td, and positioning time te by performing Steps S81 to S87 in the flowchart illustrated in FIG. 9 based on at least the rotor inertia moment and the rotational speed-torque characteristic (N-T characteristic) out of the above-described input value C21 of the inertia moment of the load, input value C11 of the positioning angle, and mechanical elements data information DB. Further, the CPU 14*c* determines a shortest value out of the positioning time te as the shortest positioning time.

Next, the CPU 14*c* of the control device 11 calculates the cycle period tp by adding the shortest positioning time obtained in Step S43 with the stop time tb obtained by calculating the above-described formula (17) (Step S44).

Figure 19:
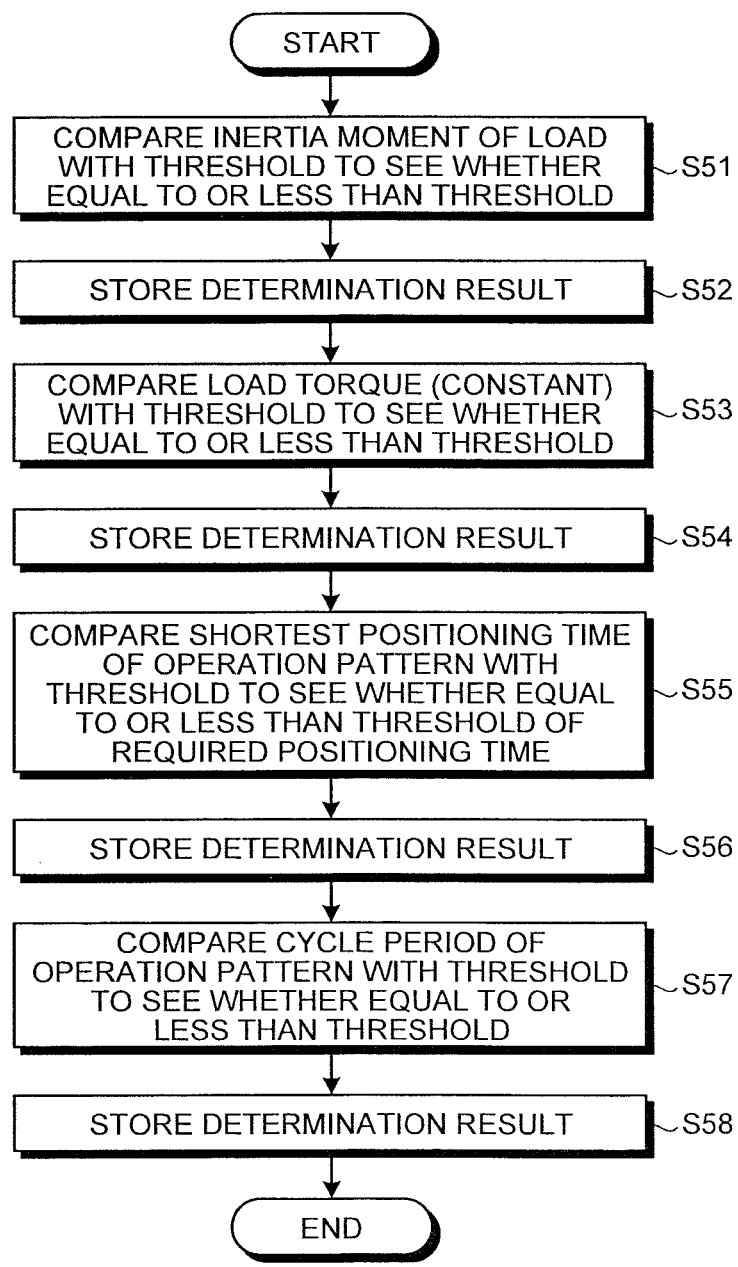
FIG. 19 is a flowchart illustrating a comparison step with the operation conditions and required conditions.

Next, the CPU 14*c* of the control device 11 executes a comparison step with the operation conditions and the required conditions, in which each operation pattern for each of the motors obtained in the simulation step (Step S4) is compared with the operating conditions and the required conditions, each item is compared with a predetermined threshold, and an adaptability determination result is stored in the external storage device 15 or the internal storage device 14*f* (Step S5). This can reduce a burden of calculation on the operator because the motor selection device 1 selects the motor based on the simulated operation pattern. FIG. 19 is a flowchart illustrating the comparison step with the operation conditions and required conditions. First, the CPU 14*c* of the control device 11 compares the inertia moment of the load with the threshold of each of the motors stored in the external storage device 15 or the internal storage device 14*f*, and in the case of evaluating the inertia moment of the load as the multiplying factor between the inertia moment of the load and the rotor inertia moment calculated in above-described Step S42, and the multiplying factor resulting in being within the predetermined threshold such as 100 times, the CPU 14*c* generates information indicating adaptable (OK). Alternatively, the CPU 14*c* compares the inertia moment of the load with the threshold of each of the motors stored in the external storage device 15 or the internal storage device 14*f*, and in the case of evaluating the inertia moment of the load as the multiplying factor between the inertia moment of the load and the rotor inertia moment calculated in above-described Step S42, and the multiplying factor resulting in exceeding the predetermined threshold such as 100 times, the CPU 14*c* generates information indicating non-adaptable (NG) (Step S51). The CPU 14*c* of the control device 11 stores, in the external storage device 15 or the internal storage device 14*f*, either one of the information indicating adaptable (OK) obtained in Step S51 and the information indicating non-adaptable (NG) obtained by the comparison with the threshold as a determination result (Step S52).

Next, the CPU 14*c* of the control device 11 compares the load torque (constant) with a threshold of each of the motors stored in the external storage device 15 or the internal storage device 14*f*, and in the case where the load torque (constant) is the threshold or less, the CPU 14*c* generates the information indicating adaptable (OK), or in the case where the load torque (constant) exceeds the threshold, the CPU 14*c* generates the information indicating non-adaptable (NG) (Step S53). The CPU 14*c* of the control device 11 stores, in the external storage device 15 or the internal storage device 14*f*, either one of the information indicating adaptable (OK) obtained in Step S53 and the information indicating non-adaptable (NG) obtained by the comparison with the threshold as a determination result (Step S54).

Next, the CPU 14*c* of the control device 11 compares the shortest positioning time of each operation pattern obtained by the simulation step (Step S4) for each of the motors with a threshold of the required positioning time stored in the external storage device 15 or the internal storage device 14*f*, and in the case where the shortest positioning time is the threshold or less, the CPU 14*c* generates the information indicating adaptable (OK), or in the case where the shortest positioning time exceeds the threshold, the CPU 14*c* generates the information indicating non-adaptable (NG) (Step S55). The CPU 14*c* of the control device 11 stores, in the external storage device 15 or the internal storage device 14*f*, either one of the information indicating adaptable (OK) obtained in Step S55 and the information indicating non-adaptable (NG) obtained by the comparison with the threshold as a determination result (Step S56).

Next, the CPU 14*c* of the control device 11 compares the cycle period of each operation pattern of each of motor obtained in the simulation step (Step S4) with a threshold which is the summation value obtained by adding the required positioning time with the required stop time stored in the external storage device 15 or the internal storage device 14*f*. In the case where the cycle period of the operation pattern is the threshold or less, the CPU 14*c* generates the information indicating adaptable (OK), or in the case where the cycle period exceeds the threshold, the CPU 14*c* generates the information indicating non-adaptable (NG) (Step S57). The CPU 14*c* of the control device 11 stores, in the external storage device 15 or the internal storage device 14*f*, either one of the information indicating adaptable (OK) obtained in Step S57 and the information indicating non-adaptable (NG) obtained by the comparison with the threshold as a determination result (Step S58).

FIG. 20 is an explanatory diagram illustrating an output display screen to display exemplary items compared in the comparison step with the operating conditions and the required conditions, and determination results. The CPU 14*c* of the control device 11 executes the above-described processing from Step S51 to Step S58 for each of the motors, and an output display screen G2 illustrated in FIG. 20 may be displayed. The CPU 14*c* of the control device 11 may store, in the external storage device 15 or the internal storage device 14*f*, comment information linked to the information indicating non-adaptable (NG) for each of the items which is compared with the operating conditions and required conditions in the comparison step, and display the output display screen G2 together with the information indicating non-adaptable (NG) in each of the items.

Next, as illustrated in FIG. 4, the CPU 14*c* of the control device 11 calculates a comprehensive determination result according to an adaptable (OK) item obtained in Step S5, and executes a comprehensive determination step to store, in the external storage device 15 or the internal storage device 14*f*, the comprehensive determination result linked to each of the motors (Step S6). The comprehensive determination result is a determination result indicated by a plurality of levels (three levels, for example) as next: adaptable indicated by a circle mark (◯), partially adaptable indicated by a triangle mark (Δ), and non-adaptable indicated by a cross mark (X). The determination result of adaptable is given only in the case where the CPU 14*c* of the control device 11 includes the information in which all of the items compared in Step S5 are adaptable (OK). The determination result of partially adaptable is given in the case where the CPU 14*c* of the control device 11 includes the information in which all of the items of the operating conditions compared in Step S5 are adaptable (OK) and further includes the information in which an item of the required conditions is non-adaptable (NG). The determination result of non-adaptable is information that is given in the case where the CPU 14*c* of the control device 11 includes the information in which the item(s) of the operating conditions compared in Step S5 is non-adaptable (NG).

Next, as illustrated in FIG. 4, the CPU 14*c* of the control device 11 executes a list display step to display, on the display device 13, a motor list together with the comprehensive determination result stored in Step S6 (Step S7). FIG. 21 is an explanatory diagram illustrating the output display screen to display an exemplary comprehensive determination result. The CPU 14c of the control device 11 displays an output display screen G3 as illustrated in FIG. 21 so as to show the comprehensive determination result corresponding to each of the motors.

For example, the display device 13 displays a list B31 as a simulation result list, an input screen button B32, and a selection button B33 inside the output display screen G3. The list B31 includes the column BS for series names, the column BN for the call number (motor index) of each of the motors, a column BJ for the comprehensive determination result of each of the motors stored in Step S6, a column BTXT for comments on determination, and a column RN for check boxes in which each row of each of the motors can be selected. By this, an operator can grasp a choice of the adaptable motor at a glance.

In the case where the user confirms display of the list B31, selects a check box in the row of a motor corresponding to the circle mark (○) indicating adaptable, and pushes the selection button B33 (Step S8, Yes), the CPU 14c of the control device 11 completes the processing. In the case where the user confirms the display of the list B31, selects a check box in the row of a motor corresponding to the triangle mark (Δ) indicating partially adaptable or the cross mark (X) indicating non-adaptable, and pushes the input screen button B32 (Step S8, No), the CPU 14c of the control device 11 returns the processing to Step S1, performs the input receiving processing for the simulation conditions, and obtains the information of the simulation conditions.

According to the method, it is possible to estimate, from among the plurality of selectable motors, the motor for which the optimal operation pattern can be selected based on the comprehensive determination result even when the operation pattern for the motor is not determined. For example, the operator can leave, as a choice, the motor which is partially adaptable indicated by the triangle mark (Δ). Since the motor having a non-adaptable item in the operating conditions is excluded, the motor having no possibility of use is excluded from the choice, and the target of the motor can be narrowed down. Therefore, the user can study the operation pattern for the motor by reconsidering the operation pattern. As a result, possibility that the selected motor has excessive performance can be reduced. Therefore, the operation pattern can be studied upon narrowing down a target of the motor. As a result, possibility that the selected motor has excessive performance can be reduced.

As described above, the motor selection device 1 can select the plurality of selectable motors 20 and suggest the optimal operation pattern from among the motor operation patterns which are defined by the positioning time te to rotate the motor output shaft 21 of the motor 20 to rotate the load body 50 by the positioning angle, and the stop time tb to stop the motor output shaft 21. The motor selection device 1 includes the input access unit, storage unit, calculation unit, and information output unit.

As the input access unit, the control device 11 performs the input receiving processing for the simulation conditions including the input value C11 of the positioning angle and the input value C21 of the inertia moment of the load as the operating conditions, and at least one of the input value C12 of the required positioning time and the input value C13 of the required stop time as the required conditions from the input device 12. As the storage unit, the external storage device 15 or the internal storage device 14f stores the mechanical elements data information DB for each of the selectable motors. As the calculation unit, the CPU 14c of the control device 11 can simulate the operation pattern for each of the stored motors under the simulation conditions, compare the obtained operation pattern for each of the motors with the operating conditions and the required conditions, make comparison with the predetermined threshold for each of the items, and calculate the comprehensive determination result in accordance with the items obtained as adaptable. Further, as the information output unit, the control device 11 outputs, to the display device 13, the information of the motor list by linking the comprehensive determination result to each of the motors.

According to the configuration, it is possible to estimate the motor for which the optimal operation pattern can be selected from among the plurality of selectable motors based on the comprehensive determination result even when the operation pattern for the motor is not determined. Therefore, the operation pattern can be studied upon narrowing down a target of the motor. As a result, possibility that the selected motor has excessive performance can be reduced.

Modified Example

Figure 22:
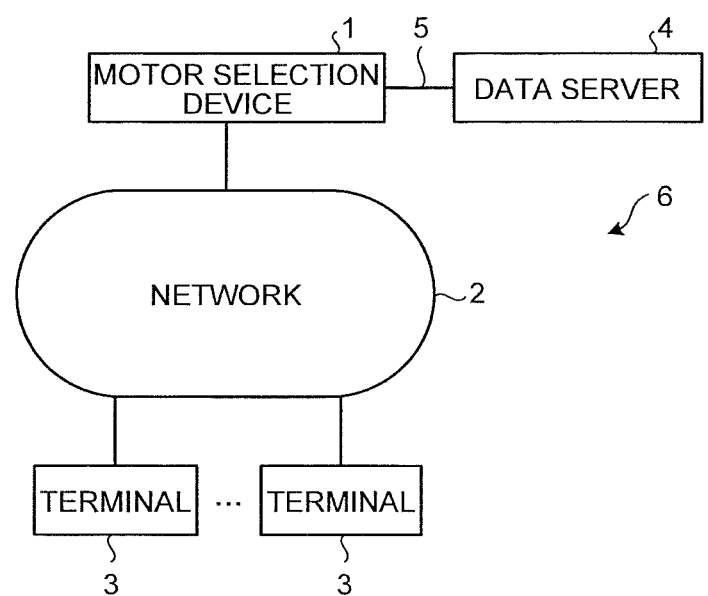
FIG. 22 is an explanatory diagram illustrating a modified example in which the motor selection device according to the present embodiment is configured as a client server system via a network.

FIG. 22 is an explanatory diagram illustrating a modified example in which the motor selection device according to the present embodiment is configured as a client server system via a network. Note that the same components described in the above embodiment are denoted by the same reference numbers, and repetition of the same description will be omitted in the modified example of the present embodiment.

A client server system 6 includes the motor selection device 1, the network 2, at least one terminal 3, a data server 4, and a network 5. The terminal 3 and the data server 4 are computers each including the above-described input interface 14a, output interface 14b, CPU 14c, ROM 14d, RAM 14e, internal storage device 14f, communication control device 14g, and internal bus 14h, and including the same configuration as the motor selection device 1, and are connected to a device having the same function as the input device 12 and a device having the same function as the display device 13.

At least one terminal 3 is connected to the motor selection device 1 via the network 2. The network 2 is the Internet, for example. Further, at least one terminals 3 functions as the input access unit that receives input operation and selecting operation of a designer, namely, the operator (user), and outputs an input signal to the control device 11 of the motor selection device 1 via the network 2. Also, at least one terminal 3 functions as the information output unit to display information transmitted from the motor selection device 1.

In the case where the above-described external storage device 15 is the server, the data server 4 is connected to the control device 11 via the network 5 such as local area network (LAN) instead of the external storage device 15. Note that the data server 4 may be disposed at a place distant from the control device 11 of the motor selection device 1, and may be connected to the motor selection device 1 via the network 2 instead of the network 5.

Thus, the motor selection device 1 according to the present embodiment is configured as the client server system 6 via the network 2.

REFERENCE SIGNS LIST

1 Motor selection device
2 Network

3 Terminal
4 Data server
5 Network
6 Client Server System
11 Control device
12 Input device
13 Display device
14a Input interface
14b Output interface
14c CPU
14d ROM
14e RAM
14f Internal storage device
14g Communication control device
14h Internal bus
15 External storage device
20 Motor
21 Motor output shaft
50 Load body
52 Conveying plate
53 Conveyed object
54 Bearing
55 Oil seal
90 Motor control circuit
ta Acceleration time
tb Stop time
tc Constant speed time
td Deceleration time
te Positioning time
tf Settling time
tp Cycle period
T Output torque
Ta, Tb, Tc, Td Torque
Te Effective torque
Ti Dynamic friction torque
Tm Constant load torque
Zr Rotary axis

The invention claimed is:

1. An optimal operation pattern selection method for a motor, in which a plurality of selectable motors is selected and an optimal operation pattern is suggested from among motor operation patterns defined by positioning time to rotate a motor output shaft of the motor to rotate a load by a positioning angle and stop time to stop the motor output shaft, the method comprising:
a simulation conditions input step of acquiring information of the simulation conditions including an input value of the positioning angle and an input value of inertia moment of the load as operating conditions, and at least one of an input value of required positioning time and an input value of required stop time as required conditions;
a simulation step including
calculating a total value of inertia moment by adding rotor inertia moment of a mechanical elements data information with the input value of the inertia moment of the load, for each of the selectable motors; and
acquiring shortest positioning time to rotate the load by the input value of the positioning angle based on the total value of the inertia moment and torque characteristic information according to a rotational angular speed or a rotational speed included in the mechanical elements data information, and
simulating an operation pattern under the simulation conditions for each of stored motors by simulating an operation pattern including the shortest positioning time for each of the motors;
a comparison step including:
obtaining an adaptability determination result of an item in the required conditions by comparing the shortest positioning time of the operation pattern for each of the motors obtained in the simulation step with the input value of the required positioning time under the required conditions,
obtaining an adaptability determination result of an item in the operating conditions by comparing at least the input value of the inertia moment of the load included in the operation conditions with a predetermined threshold value, and
among items of a plurality of determination results including at least the adaptability determination result of the item in the required conditions and the adaptability determination result of the item in the operating conditions, identifying and storing items having an adaptable determination result as adaptable items; and
a comprehensive determination step of calculating a comprehensive determination results that varies according to combination of adaptable items obtained in the comparison step, and storing the comprehensive determination results linked to each of the motors; and
a list display step of displaying, together with the comprehensive determination result stored in the comprehensive determination step, a list of the motors that enables to select of one of the motors; and
selecting one of the motors from the list of the motors from the comprehensive determination results.

2. The optimal operation pattern selection method for a motor according to claim 1, wherein in a case where a first item in the operation conditions is adaptable and second item in the required conditions is unadaptable, providing a determination result of partially adaptable as the comprehensive determination results in the comprehensive determination step,
wherein being adaptable indicates that the first item satisfies a plurality of first conditions,
wherein being unadaptable indicates that the second item does not satisfy a plurality of second conditions, and
wherein being partially adaptable indicates a combination of the first item, satisfying the plurality of first conditions, and the second item, which does not satisfy the plurality of second conditions.

3. The optimal operation pattern selection method for a motor according to claim 2, wherein the determination result indicating partially adaptable is displayed on the list of the motors in the list display step.

4. The optimal operation pattern selection method according to claim 1, wherein the simulation step is executed under the condition that the input value of the positioning angle, the input value of the inertia moment of the load, and the input value of the required positioning time or the input value of the required stop time are input in the simulation conditions input step.

5. The optimal operation pattern selection method for a motor according to claim 1, wherein in a case where the torque characteristic information according to a rotational angular speed or a rotational speed of a stored motor has constant output torque when rotation of the motor output shaft is varied from zero to a maximum rotational angular speed or a maximum rotational speed, an operation pattern is simulated such that rotation by the positioning angle is performed by rotation of the motor output shaft during acceleration time in which rotation of the motor output shaft is accelerated and during deceleration time in which rotation of the motor output shaft is decelerated.

6. The optimal operation pattern selection method according to claim 1, wherein in a case where the torque characteristic information according to a rotational angular speed or a rotational speed of a stored motor has a break point which is a change point where output torque is reduced while rotation of the motor output shaft changes from zero to a maximum rotational angular speed or while rotation of the motor output shaft changes from zero to a maximum rotational speed, an operation pattern is simulated in a first area where a rotational angular speed or a rotational speed changes to the break point such that rotation by the positioning angle is performed by rotation of the motor output shaft during the acceleration time in which rotation of the motor output shaft is accelerated and deceleration time in which rotation of the motor output shaft is decelerated.

7. The optimal operation pattern selection method for a motor according to claim 6, wherein simulation is executed in a second area where rotational angular speed is varied from the break point to the maximum rotational angular speed or the maximum rotational speed such that rotation by the positioning angle is performed by rotation of the motor output shaft during the acceleration time in which rotation of the motor output shaft is accelerated, constant speed time in which rotation of the motor output shaft is rotated at a constant speed, and the deceleration time in which rotation of the motor output shaft is decelerated.

8. The optimal operation pattern selection method for a motor according to claim 7, wherein positioning time to rotate the motor output shaft in the second area is shortest positioning time among positioning time calculated for each of sections obtained by dividing the second area into a plurality of the sections.

9. A motor selection device to select a plurality of selectable motors and suggest an optimal operation pattern from among motor operation patterns defined by positioning time to rotate a motor output shaft of the motor to rotate a load by a positioning angle and stop time to stop the motor output shaft, the motor selection device comprising:
a memory storing instructions; and
at least one hardware processor configured to execute the instructions to implement:
an input access unit to receive input of information of the simulation conditions including an input value of the positioning angle and an input value of inertia moment of the load as operating conditions, and at least one of an input value of required positioning time and an input value of required stop time as required conditions;
a storage device to store a mechanical elements data information for each of the selectable motors;
a calculation unit to perform
calculating a total value of inertia moment by adding rotor inertia moment of a mechanical elements data information with the input value of the inertia moment of the load, for each of the selectable motors,
acquiring shortest positioning time to rotate the load by the input value of the positioning angle based on the total value of the inertia moment and torque characteristic information according to a rotational angular speed or a rotational speed included in the mechanical elements data information,
simulating an operation pattern including the shortest positioning time for each of the motors,
obtaining an adaptability determination result of an item in the required conditions by comparing the shortest positioning time of the operation pattern for each of the motors obtained in the simulation step with the input value of the required positioning time under the required conditions,
obtaining an adaptability determination result of an item in the operating conditions by comparing at least the input value of the inertia moment of the load included in the operation conditions with a predetermined threshold value,
among items of a plurality of determination results including at least the adaptability determination result of the item in the required conditions and the adaptability determination result of the item in the operating conditions, identifying items having an adaptable determination result as adaptable items and storing the identified items in the storage device, and
calculating a comprehensive determination result that varies according to combination of adaptable items; and
an information output unit to output, by linking the comprehensive determination result to each of the motors, information of a list of the motors to enable the input access unit to receive selection of one of the motors; and
selecting one of the motors from the list of the motors from the comprehensive determination results.

10. The motor selection device according to claim 9, wherein in a case where a first item in the operation conditions is adaptable and second item in the required conditions is unadaptable, providing a determination result of partially adaptable is provided as the comprehensive determination results,
wherein being adaptable indicates that the first item satisfies a plurality of first conditions,
wherein being unadaptable indicates that the second item does not satisfy a plurality of second conditions, and
wherein being partially adaptable indicates a combination of the first item, satisfying the plurality of first conditions, and the second item, which does not satisfy the plurality of second conditions.

11. The motor selection device according to claim 10, wherein the information output unit outputs information including the determination result indicating partially adaptable in the list of the motors.

12. The motor selection device according to claim 9, wherein the calculation unit performs simulating the operation pattern under the condition that the input value of the positioning angle, the input value of the inertia moment of the load, and the input value of the required positioning time or the input value of the required stop time are input.

13. The motor selection device according to claim 9, wherein in a case where the torque characteristic information according to a rotational angular speed or a rotational speed of a stored motor has constant output torque when rotation of the motor output shaft is varied from zero to a maximum rotational angular speed or a maximum rotational speed, an operation pattern is simulated such that rotation by the positioning angle is performed by rotation of the motor output shaft during acceleration time in which rotation of the motor output shaft is accelerated and during deceleration time in which rotation of the motor output shaft is decelerated.

14. The motor selection device according to claim 9, wherein in a case where the torque characteristic information according to a rotational angular speed or a rotational speed of a stored motor has a break point which is a change point where output torque is reduced while rotation of the motor output shaft changes from zero to a maximum rotational angular speed or while rotation of the motor output shaft changes from zero to a maximum rotational speed, an operation pattern is simulated in a first area where a rotational angular speed or a rotational speed changes to the break point such that rotation by the positioning angle is performed by rotation of the motor output shaft during the acceleration time in which rotation of the motor output shaft is accelerated and deceleration time in which rotation of the motor output shaft is decelerated.

15. The motor selection device according to claim 14, wherein simulation is executed in a second area where rotational angular speed is varied from the break point to the maximum rotational angular speed or the maximum rotational speed such that rotation by the positioning angle is performed by rotation of the motor output shaft during the acceleration time in which rotation of the motor output shaft is accelerated, constant speed time in which rotation of the motor output shaft is rotated at a constant speed, and the deceleration time in which rotation of the motor output shaft is decelerated.

16. The motor selection device according to claim 15, wherein positioning time to rotate the motor output shaft in the second area is shortest positioning time among positioning time calculated for each of sections obtained by dividing the second area into a plurality of the sections.

* * * * *